(12) United States Patent
Park et al.

(10) Patent No.: US 12,538,677 B2
(45) Date of Patent: Jan. 27, 2026

(54) DISPLAY APPARATUS

(71) Applicant: Samsung Display Co., LTD., Yongin-si (KR)

(72) Inventors: Heejean Park, Yongin-si (KR); Hyeongseok Kim, Yongin-si (KR); Sunhwa Lee, Yongin-si (KR); Mukyung Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/828,726

(22) Filed: Sep. 9, 2024

(65) Prior Publication Data

US 2025/0098458 A1 Mar. 20, 2025

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
None
See application file for complete search history.

(56) References Cited

U.S. PATENT DOCUMENTS

| | | | |
|---|---|---|---|
| RE45,400 E | 3/2015 | Yamashita et al. | |
| 10,461,142 B2 * | 10/2019 | Hong | H10K 77/10 |
| 10,679,566 B2 * | 6/2020 | Jeon | G09G 3/3258 |
| 10,693,091 B2 * | 6/2020 | Kim | H10K 77/111 |
| 10,748,982 B2 * | 8/2020 | Hong | H10K 77/10 |
| 11,158,826 B2 * | 10/2021 | Kim | H10K 77/111 |
| RE48,895 E | 1/2022 | Jeong et al. | |
| 11,251,255 B2 * | 2/2022 | Hong | H10K 59/121 |
| 11,341,921 B2 * | 5/2022 | Shin | G09G 3/3266 |
| 11,594,591 B2 * | 2/2023 | Park | H10K 59/124 |
| 11,621,399 B2 * | 4/2023 | Sano | H10K 77/111 257/72 |
| 11,683,976 B2 * | 6/2023 | Kim | H10D 86/451 257/400 |
| 11,737,320 B2 * | 8/2023 | Park | H10D 86/451 257/40 |
| 11,950,444 B2 * | 4/2024 | Park | H10K 59/8731 |
| 11,985,867 B2 * | 5/2024 | Cao | H10K 59/131 |
| 11,990,095 B2 * | 5/2024 | Shin | G09F 9/301 |
| 12,041,827 B2 * | 7/2024 | Yi | H10K 77/111 |
| 12,057,066 B2 * | 8/2024 | An | G09G 3/2003 |

(Continued)

FOREIGN PATENT DOCUMENTS

CN 112767868 A 5/2021
CN 115762382 A 3/2023

(Continued)

*Primary Examiner* — Vinh T Lam
(74) *Attorney, Agent, or Firm* — CANTOR COLBURN LLP

(57) ABSTRACT

Provided is a display apparatus. A pixel including a capacitor electrically connected to a first electrode of a light-emitting diode and a sustain voltage line is arranged in an island portion of a display area. A vertical voltage line, which is a portion of the sustain voltage line extending to a bridge portion, includes a first sub-line and a second sub-line spaced apart from each other in a plan view. In the bridge portion, the first sub-line and the second sub-line do not overlap upper data lines.

20 Claims, 34 Drawing Sheets

(56) References Cited

U.S. PATENT DOCUMENTS

| | | | |
|---|---|---|---|
| 12,089,456 B2* | 9/2024 | Hong | H10K 59/352 |
| 12,106,689 B2* | 10/2024 | Ju | H10K 59/131 |
| 12,127,449 B2* | 10/2024 | Won | H10K 59/128 |
| 12,133,405 B2* | 10/2024 | Yun | H10K 59/80515 |
| 12,213,366 B2* | 1/2025 | Bang | G06F 3/0412 |
| 12,225,792 B2* | 2/2025 | Lee | H10K 59/131 |
| 12,376,461 B2* | 7/2025 | Zhang | H10D 89/931 |
| 2018/0174523 A1 | 6/2018 | Jeon et al. | |
| 2018/0190197 A1 | 7/2018 | Chang et al. | |
| 2020/0168686 A1* | 5/2020 | Han | H10K 59/1213 |
| 2020/0312248 A1 | 10/2020 | Shin et al. | |
| 2020/0381505 A1* | 12/2020 | Cho | H10K 59/131 |
| 2021/0408196 A1* | 12/2021 | Han | H10K 59/126 |
| 2023/0031474 A1 | 2/2023 | Qian et al. | |
| 2023/0038587 A1 | 2/2023 | Lou et al. | |
| 2023/0110048 A1 | 4/2023 | Won et al. | |
| 2023/0206843 A1* | 6/2023 | Lee | H10K 59/131 345/55 |
| 2024/0224771 A1* | 7/2024 | Kim | H10K 59/1213 |
| 2024/0251611 A1* | 7/2024 | Ding | H10K 59/124 |
| 2024/0363056 A1* | 10/2024 | Park | G09G 3/3233 |
| 2024/0381725 A1* | 11/2024 | Zhang | G02F 1/1362 |
| 2024/0389413 A1* | 11/2024 | Lu | H10K 59/131 |
| 2024/0397761 A1 | 11/2024 | Shi et al. | |
| 2024/0397777 A1* | 11/2024 | Liu | H10K 59/1213 |
| 2025/0008787 A1* | 1/2025 | Zhang | H10K 59/1216 |
| 2025/0063908 A1* | 2/2025 | Seo | H10K 59/1201 |

FOREIGN PATENT DOCUMENTS

| | | |
|---|---|---|
| KR | 101264386 B1 | 5/2013 |
| KR | 1020180072022 A | 6/2018 |
| KR | 1020180078109 A | 7/2018 |
| KR | 1020200115772 A | 10/2020 |
| KR | 102224743 B1 | 3/2021 |
| KR | 1020230044047 A | 4/2023 |
| WO | 2022017058 A1 | 1/2022 |
| WO | 2023044682 A1 | 3/2023 |

* cited by examiner

DISPLAY APPARATUS

This application claims priority to Korean Patent Application No. 10-2023-0124999, filed on Sep. 19, 2023, and all the benefits accruing therefrom under 35 U.S.C. § 119, the content of which in its entirety is herein incorporated by reference.

BACKGROUND

1. Field

One or more embodiments relate to a display apparatus, and more particularly, to a stretchable display apparatus.

2. Description of the Related Art

With the development of display apparatuses that visually display electrical signals, various display apparatuses having excellent characteristics, such as, for example, reduced thickness, lighter weight, and low power consumption, have been introduced. For example, flexible display apparatuses that are foldable or rollable have been introduced. Recently, research and development on stretchable display apparatuses that are transformable into various forms have been actively conducted.

SUMMARY

One or more embodiments may provide a display apparatus having improved display quality. However, the embodiments are examples and do not limit the scope of the disclosure.

Additional aspects will be set forth in part in the description which follows and, in part, will be apparent from the description, or may be learned by practice of the presented embodiments of the disclosure.

According to one or more embodiments, a display apparatus includes a display area in which a plurality of island portions connected to the plurality of island portions are defined, wherein each of the plurality of bridge portions connects at least two island portions of the plurality of island portions, wherein a pixel circuit and a light-emitting diode connected to the pixel circuit are arranged in each of the plurality of island portions. The pixel circuit may include a first transistor, a second transistor electrically connected to a first terminal of the first transistor and a node, a third transistor electrically connected to a first voltage line and the node, a fourth transistor electrically connected to the node and a second voltage line, a first capacitor electrically connected to a gate of the first transistor and the node, and a second capacitor electrically connected to a first electrode of the light-emitting diode and the second voltage line. The plurality of bridge portions may include a first bridge portion connecting island portions adjacent in a first direction, and a second bridge portion connecting island portions adjacent in a second direction. The second voltage line may include a first horizontal voltage line in the first bridge portion and a first vertical voltage line in the second bridge portion, wherein the first vertical voltage line may include a first sub-line and a second sub-line and, in a plan view, the first sub-line and the second sub-line are spaced apart from each other.

In an embodiment, the pixel circuit may further include a fifth transistor electrically connected to a data line and the first terminal of the first transistor, the data line may extend in the second direction and may be arranged in the second bridge portion and in island portions adjacent in the second direction, and, in the plan view, in the second bridge portion, the data line may not overlap the first sub-line and the second sub-line.

In an embodiment, the second bridge portion may include a first insulating layer between a substrate and the first vertical voltage line, and a second insulating layer between the first vertical voltage line and the data line.

In an embodiment, a first horizontal voltage connection line electrically connected to the first voltage line may be arranged in the first bridge portion, and a first vertical voltage connection line electrically connected to the first voltage line may be arranged in the second bridge portion.

In an embodiment, in the plan view, the first vertical voltage connection line may overlap the first sub-line and the second sub-line.

In an embodiment, the display apparatus may further include a third insulating layer between the data line and the first vertical voltage connection line.

In an embodiment, the display apparatus may further include a third voltage line electrically connected to a second electrode of the light-emitting diode, the third voltage line including a second horizontal voltage line in the first bridge portion and a second vertical voltage line in the second bridge portion.

In an embodiment, the first horizontal voltage connection line and the second horizontal voltage line in the first bridge portion may be arranged on a same layer, and the first vertical voltage connection line and the second vertical voltage line in the second bridge portion may be arranged on a same layer.

In an embodiment, in the plan view, the first vertical voltage connection line and the second vertical voltage line may not overlap the data line.

In an embodiment, the second capacitor may include a first electrode and a second electrode that is disposed on the first electrode and overlaps the first electrode, and each of the plurality of island portions may include a first connection electrode electrically connected to the first electrode of the second capacitor, a second connection electrode electrically connected to the second electrode of the second capacitor and the second voltage line, and a third connection electrode electrically connected to the first connection electrode.

In an embodiment, the first electrode of the second capacitor and the gate of the first transistor may be arranged on a same layer.

In an embodiment, the first capacitor may include a first electrode and a second electrode that is disposed on the first electrode and overlaps the first electrode, the first electrode of the first capacitor may be a portion of the gate of the first transistor, and the second electrode of the first capacitor may be electrically connected to the node.

In an embodiment, the second electrode of the first capacitor and the second electrode of the second capacitor may be arranged on a same layer.

In an embodiment, each of the plurality of island portions may include a first electrode pad electrically connected to the third connection electrode and the first electrode of the light-emitting diode, a third voltage line comprising a second horizontal voltage line in the first bridge portion and a second vertical voltage line in the second bridge portion, and a second electrode pad electrically connected to the third voltage line and the second electrode of the light-emitting diode.

According to one or more embodiments, a display apparatus includes a display area in which a plurality of island portions and a plurality of bridge portions connected to the plurality of island portions are defined, wherein each of the plurality of bridge portions connects at least two island portions of the plurality of island portions. Each of the plurality of island portions includes a first pixel circuit connected to a first data line, a second pixel circuit connected to a second data line, and a third pixel circuit connected to a third data line. Each of the first pixel circuit, the second pixel circuit, and the third pixel circuit includes a first transistor, a second transistor electrically connected to a first terminal of the first transistor and a node, a third transistor electrically connected to a first voltage line and the node, a fourth transistor electrically connected to the node and a second voltage line, a first capacitor electrically connected to a gate of the first transistor and the node, and a second capacitor electrically connected to a first electrode of a light-emitting diode and the second voltage line. The second capacitor includes a first electrode and a second electrode, the first electrode of the second capacitor is electrically connected to the first electrode of the light-emitting diode, and the second electrode of the second capacitor are electrically connected to the second voltage line. The second electrodes of the second capacitors of the first pixel circuit, the second pixel circuit, and the third pixel circuit are integrated as a single body.

In an embodiment, the plurality of bridge portions may include a first bridge portion connecting island portions adjacent in a first direction, and a second bridge portion connecting island portions adjacent in a second direction, and the second voltage line may include a first horizontal voltage line in the first bridge portion and a first vertical voltage line in the second bridge portion, wherein the first vertical voltage line may include a first sub-line and a second sub-line and, in a plan view, the first sub-line and the second sub-line may be spaced apart from each other.

In an embodiment, the first data line, the second data line, and the third data line may extend to the second bridge portion, and, in a plan view, in the second bridge portion, the first sub-line may be between the first data line and the second data line, and the second sub-line may be between the second data line and the third data line.

In an embodiment, a third voltage line electrically connected to a second electrode of the light-emitting diode may be arranged in each of the plurality of island portions, the third voltage line may include a second horizontal voltage line in the first bridge portion and a second vertical voltage line in the second bridge portion, a horizontal voltage connection line electrically connected to the first voltage line may be arranged in the first bridge portion, a vertical voltage connection line electrically connected to the first voltage line may be arranged in the second bridge portion, and, in a plan view, in the second bridge portion, the second vertical voltage line and the vertical voltage connection line may not overlap the first data line, the second data line, and the third data line.

In an embodiment, the first electrode of the second capacitor and the gate of the first transistor may be arranged on a same layer.

In an embodiment, the first capacitor may include a first electrode and a second electrode, the first electrode of the first capacitor may be a portion of the gate of the first transistor, and the second electrode of the first capacitor may be electrically connected to the node.

BRIEF DESCRIPTION OF THE DRAWINGS

The above and other aspects, features, and advantages of embodiments of the present disclosure will be more apparent from the following description taken in conjunction with the accompanying drawings, in which.

DETAILED DESCRIPTION

Figure 1:
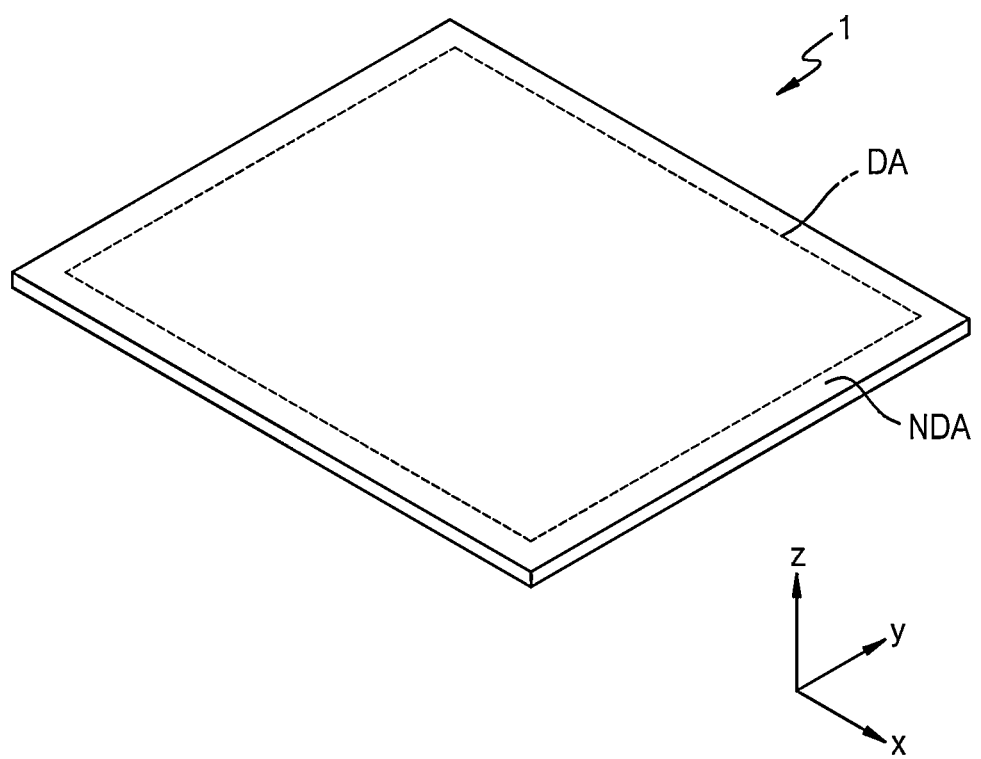
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" may indicate only a, only b, only c, both a and b, both a and c, both b and c, all of a, b, and c, or variations thereof.

Because various modifications may be applied and one or more embodiments may be implemented, specific embodiments will be illustrated in the drawings and described in detail in the detailed description. Effects and features, and methods for achieving them will be clarified with reference to embodiments described below in detail with reference to the drawings. However, the embodiments may have different forms and should not be construed as being limited to the descriptions set forth herein.

It will be understood that although terms "first" and "second" may be used herein to describe various elements, these elements should not be limited by these terms and these terms as used herein may distinguish one element from another.

In the following embodiments, the singular forms include the plural forms unless the context clearly indicates otherwise.

It will be understood that terms "comprise," "include," and "have" used herein specify the presence of stated features or elements, but do not preclude the presence or addition of one or more other features or elements.

It will be further understood that, when a layer, region, or element is referred to as being "on" another layer, region, or element, the layer, region, or element can be directly or indirectly on the other layer, region, or element. That is, e.g., intervening layers, regions, or elements may be present.

In the present specification, the expression "A and/or B" indicates A, B, or A and B. Also, the expression "at least one of A and B" indicates A, B, or A and B.

In the following embodiments, when X and Y are connected to each other, this may include a case where X and Y are electrically connected, a case where X and Y are functionally connected, and a case where X and Y are physically connected to each other, with or without intervening elements (e.g., direct or indirect connection). In this case, X and Y may be objects, for example, apparatuses, elements, circuits, wires, electrodes, terminals, conductive films, layers, or the like. Accordingly, this is not limited to certain connection relationships, for example, connection relationships illustrated in the drawings or in the detailed description, and may also include connection relationships other than those illustrated in the drawings or in the detailed description.

When X and Y are electrically connected to each other, this may include, for example, a case where X and Y are directly connected to each other and a case where one or more elements (e.g., switches, transistors, capacitive elements, inductors, resistance elements, diodes, or the like) that may enable electrical connection between X and Y are connected between X and Y.

In the following embodiments, the term "ON" used in association with the state of an element may refer to an activated state of the element, and "OFF" may refer to a deactivated state of the element. The term "ON" used in association with a signal received by an element may refer to a signal that activates the element, and "OFF" may refer to a signal that deactivates the element. The element may be activated by a high level voltage or a low level voltage. For example, a P-channel transistor (P-type transistor) is activated by a low level voltage, and an N-channel transistor (N-type transistor) is activated by a high level voltage. Accordingly, it should be understood that "ON" voltages for the P-type transistor and the N-type transistor are opposite (low vs. high) voltage levels.

In the following embodiments, the x-axis, the y-axis, and the z-axis are not limited to directions according to three axes of the rectangular coordinate system, and may be interpreted in a broader sense. For example, the x-axis, the y-axis, and the z-axis may be orthogonal to each other, but may refer to different directions that are not orthogonal to each other.

In present specification, when a certain embodiment may be implemented differently, a specific process order may also be performed differently from the described order. As an example, two processes that are successively described may be performed substantially simultaneously or performed in an order opposite to the order described. The term "substantially," as used herein, may mean approximately or actually.

Sizes of elements in the drawings may be exaggerated for convenience of description. For example, because sizes and thicknesses of elements in the drawings are arbitrarily illustrated for convenience of explanation, the following embodiments are not limited thereto.

Figure 2A:
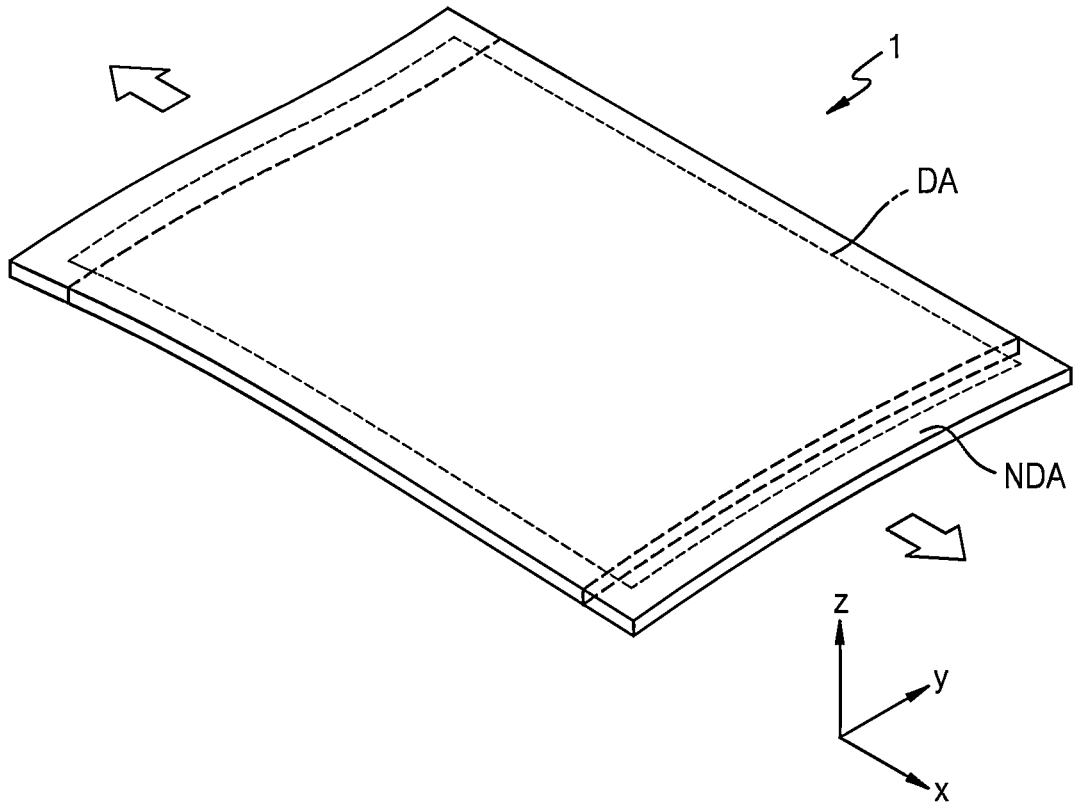
FIGS. 2A and 2B are perspective views illustrating a state in which the display apparatus of FIG. 1 is stretched in a first direction.
Figure 2B:
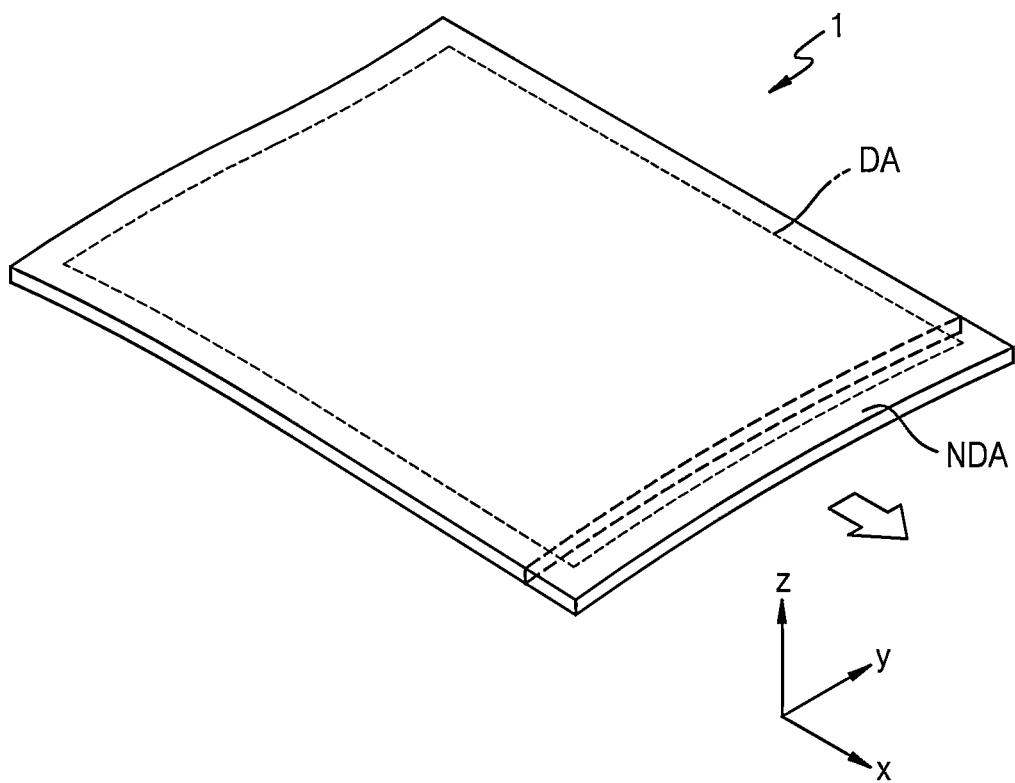
Figure 2C:
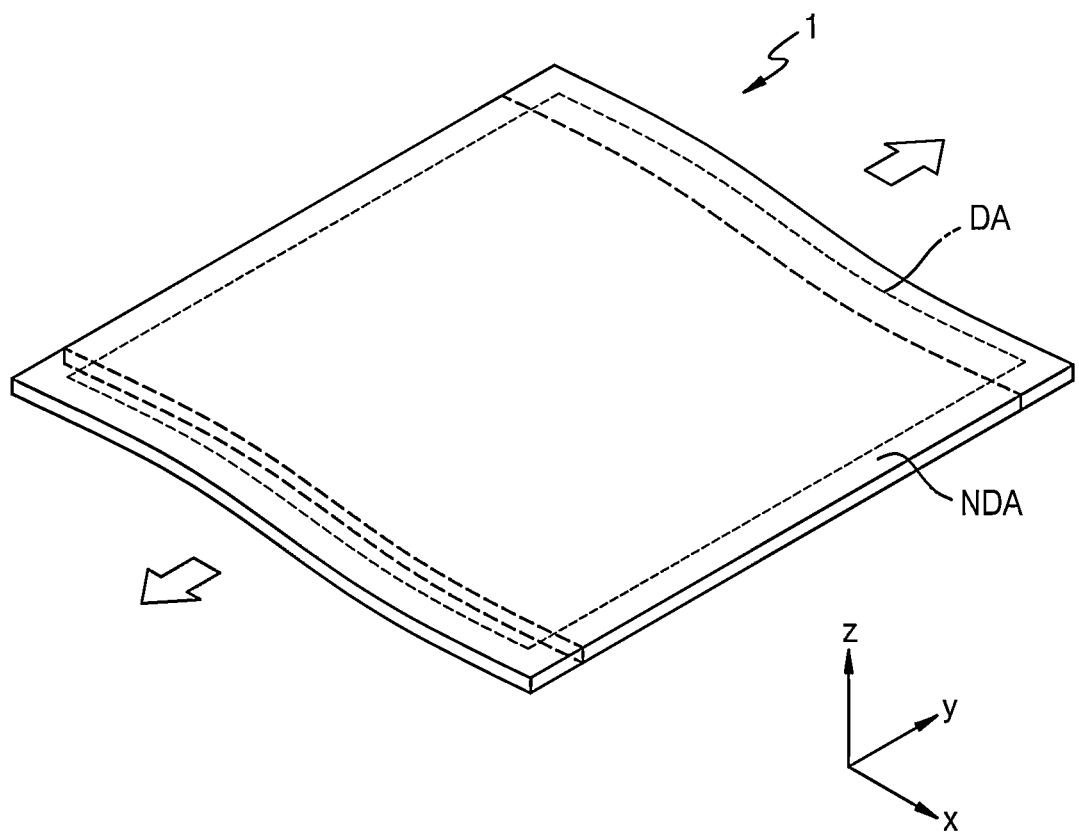
FIG. 2C is a perspective view illustrating a state in which the display apparatus of FIG. 1 is stretched in a second direction.
Figure 2D:
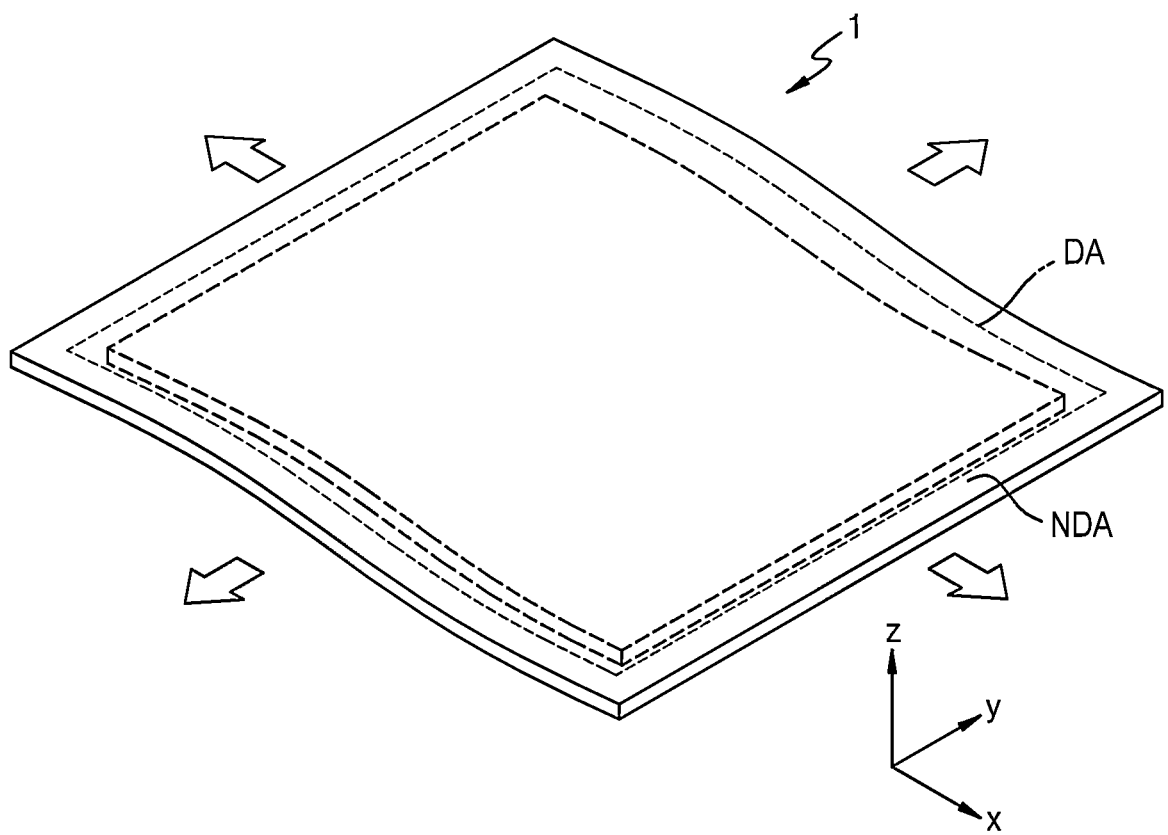
FIG. 2D is a perspective view illustrating a state in which the display apparatus of FIG. 1 is stretched in a first direction and a second direction.
Figure 2E:
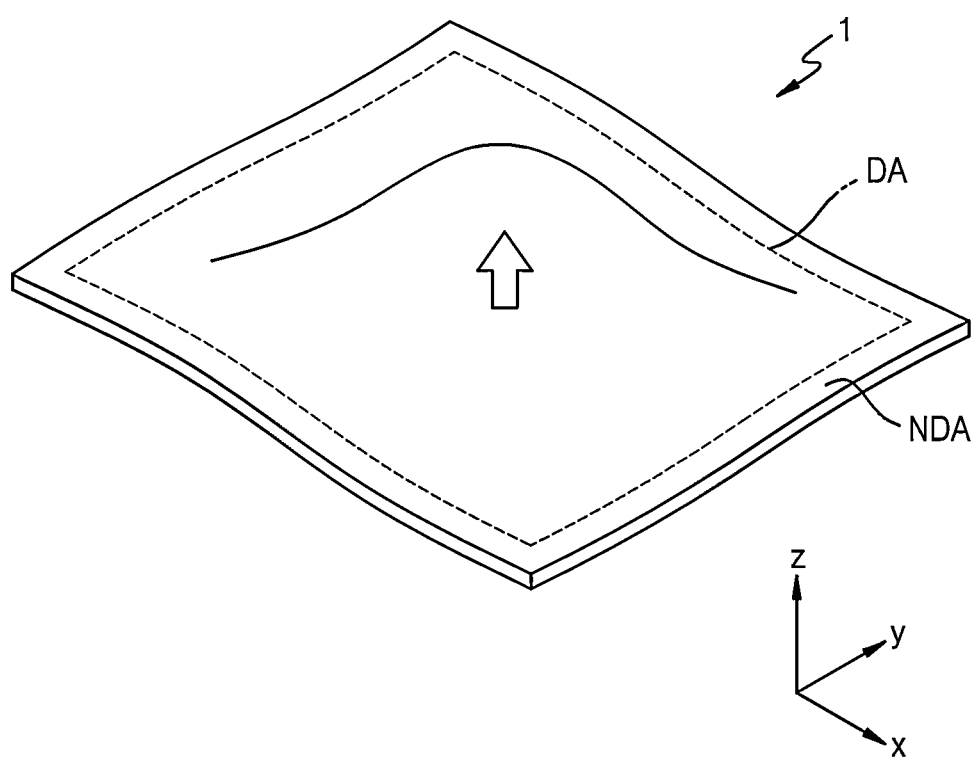
FIG. 2E is a perspective view illustrating a state in which the display apparatus of FIG. 1 is stretched in a third direction.

FIG. 1 is a schematic perspective view of a display apparatus 1 according to an embodiment. FIGS. 2A and 2B are perspective views illustrating a state in which the display apparatus 1 of FIG. 1 is stretched in a first direction. FIG. 2C is a perspective view illustrating a state in which the display apparatus 1 of FIG. 1 is stretched in a second direction. FIG. 2D is a perspective view illustrating a state in which the display apparatus 1 of FIG. 1 is stretched in a first direction and a second direction. FIG. 2E is a perspective view illustrating a state in which the display apparatus 1 of FIG. 1 is stretched in a third direction.

Referring to FIG. 1, the display apparatus 1 may be a stretchable display apparatus that may be stretched or shrunk in various directions. The display apparatus 1 may include a display area DA and a non-display area NDA. The display area DA may include a plurality of pixels. The display apparatus 1 may provide certain images by using light emitted from the plurality of pixels. The non-display area NDA may be arranged outside the display area DA. The non-display area NDA may entirely surround the display area DA.

The display apparatus 1 may be stretched in a first direction (e.g., an x-direction and/or −x direction) by an external force applied by an external object or a user. In an embodiment, as illustrated in FIGS. 2A and 2B, the display area DA and/or the non-display area NDA of the display apparatus 1 may be stretched in the first direction (e.g., the x-direction and/or −x direction). For example, as illustrated in FIG. 2A, the display apparatus 1 may be stretched in the x-direction and −x direction, or the display apparatus 1 may be stretched in the x-direction or −x direction while one side of the display apparatus 1 is fixed. FIG. 2B illustrates an example in which the display apparatus 1 is stretched in the x-direction while one side of the display apparatus 1 is fixed.

The display apparatus 1 may be stretched in a second direction (e.g., a y-direction and/or −y direction) by an external force applied by an external object or a user. In an embodiment, as illustrated in FIG. 2C, the display area DA and/or the non-display area NDA of the display apparatus 1 may be stretched in the y-direction and −y direction. In another embodiment, the display apparatus 1 may be stretched in the y-direction or −y direction while one side of the display apparatus 1 is fixed.

The display apparatus 1 may be stretched in a plurality of directions, for example, in the first direction (e.g., the x-direction and/or −x direction) and the second direction (e.g., the y-direction and/or −y direction), by an external force applied by an external object or a part of the body of a user. As illustrated in FIG. 2D, the display area DA and/or the non-display area NDA of the display apparatus 1 may be stretched in a ±x direction and ±y direction.

The display apparatus 1 may be stretched in a third direction (e.g., a z-direction or −z direction) by an external force applied by an external object or a part of the body of a user. In an embodiment, FIG. 2E illustrates that a portion of the display apparatus 1, for example, an area of the display area DA, protrudes in the z-direction. In another embodiment, a portion of the display apparatus 1, for example, an area of the display area DA, may protrude in the z direction (or be recessed in the −z-direction).

FIGS. 2A to 2E show that the display apparatus 1 is stretched in the first direction, the second direction, and/or the third direction, but one or more embodiments are not limited thereto. In another embodiment, the display apparatus 1 may be transformed into various irregular shapes, such as, for example, by being bent or twisted along two or more axes.

Figure 3:
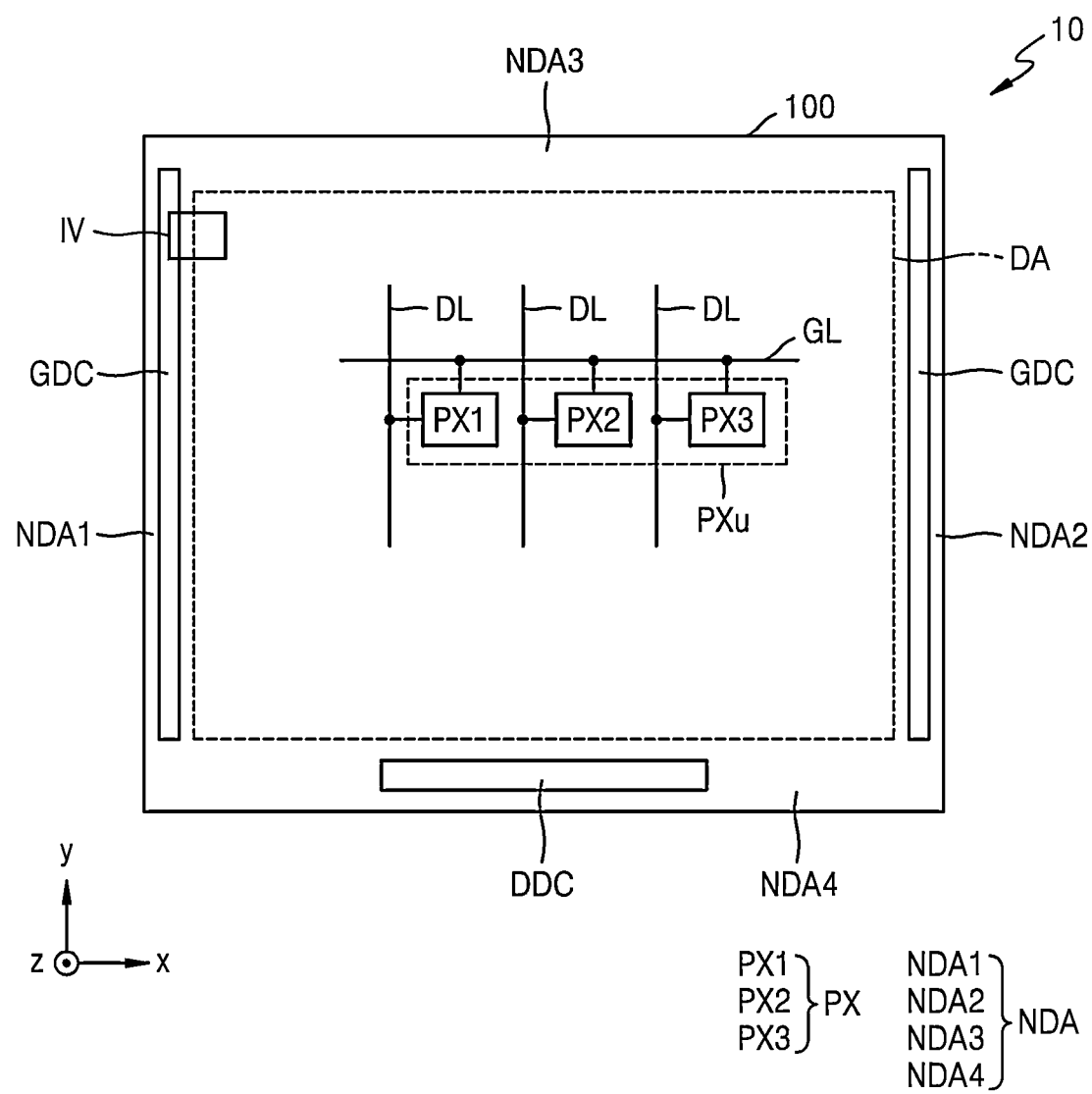
FIG. 3 is a schematic plan view of a display apparatus according to an embodiment.

FIG. 3 is a schematic plan view of the display apparatus 1 according to an embodiment.

The display apparatus 1 may include a display panel 10, and the display panel 10 may include a substrate 100.

A plurality of pixels PX may be arranged in a display area DA of the substrate 100. The plurality of pixels PX may include a first pixel PX1 that emits light of a first color, a second pixel PX2 that emits light of a second color, and a third pixel PX3 that emits light of a third color. For example, the first pixel PX1 may be a red pixel, the second pixel PX2 may be a green pixel, and the third pixel PX3 may be a blue pixel. Each of the first pixel PX1, the second pixel PX2, and the third pixel PX3 may include a pixel circuit and a light-emitting element electrically connected to the pixel circuit. The pixel circuit may include a plurality of transistors and at least one capacitor and may be a pixel driving circuit that controls driving of the light-emitting element. A plurality of conductive lines (e.g., gate lines GL, data lines DL, and voltage lines) that provide electrical signals to the pixels PX may be arranged in the display area DA.

A unit pixel PXu including the first pixel PX1, the second pixel PX2, and the third pixel PX3 may be repeatedly arranged in an x-direction and a y-direction according to a certain pattern. The first pixel PX1, the second pixel PX2, and the third pixel PX3 in the unit pixel PXu may be connected to the same gate line GL and respectively connected to corresponding data lines DL.

A driving circuit that provides electrical signals to light-emitting elements arranged in the display area DA and pixel circuits electrically and respectively connected to the light-emitting elements may be arranged in the non-display area NDA around the display area DA. A gate driving circuit GDC may be arranged in each of a first non-display area NDA1 and a second non-display area NDA2, which are arranged on both sides of the display area DA with the display area DA therebetween. The gate driving circuit GDC may be connected to the gate lines GL arranged in the display area DA.

FIG. 3 illustrates that the gate driving circuit GDC is arranged in each of the first non-display area NDA1 and the second non-display area NDA2, but one or more embodiments are not limited thereto. In another embodiment, the gate driving circuit GDC may be arranged in one of the first non-display area NDA1 and the second non-display area NDA2. A portion or all of the gate driving circuit GDC may be directly formed in the non-display area NDA during a process of forming the transistors constituting the pixel circuit in the display area DA.

A data driving circuit DDC may be arranged in a third non-display area NDA3 and/or a fourth non-display area NDA4, which connect the first non-display area NDA1 to the second non-display area NDA2. In an embodiment, FIG. 3 illustrates that the data driving circuit DDC is arranged in the fourth non-display area NDA4. In another embodiment, the data driving circuit DDC may be arranged in each of the third non-display area NDA3 and the fourth non-display area NDA4.

The data driving circuit DDC may be formed as an integrated circuit chip. In an embodiment, the data driving circuit DDC may be directly arranged in the fourth non-display area NDA4 of the substrate 100, as illustrated in FIG. 3, by using a chip on glass (COG) method or a chip on plastic (COP) method. In another embodiment, the display apparatus 1 may further include a flexible circuit board (not illustrated) electrically connected through a terminal portion (not illustrated) arranged in the fourth non-display area NDA4 of the substrate 100, and the data driving circuit DDC may be disposed on the flexible circuit board.

An elongation of the non-display area NDA may be less than or equal to an elongation of the display area DA. In an embodiment, the elongation may be different for each area of the non-display area NDA. For example, the first non-display area NDA1, the second non-display area NDA2, and the third non-display area NDA3 may have substantially the same elongation, but an elongation of the fourth non-display area NDA4 may be less than an elongation of each of the first non-display area NDA1, the second non-display area NDA2, and the third non-display area NDA3. The term "substantially the same," as used herein, may mean approximately or actually the same (e.g., within a threshold difference amount).

Figure 4:
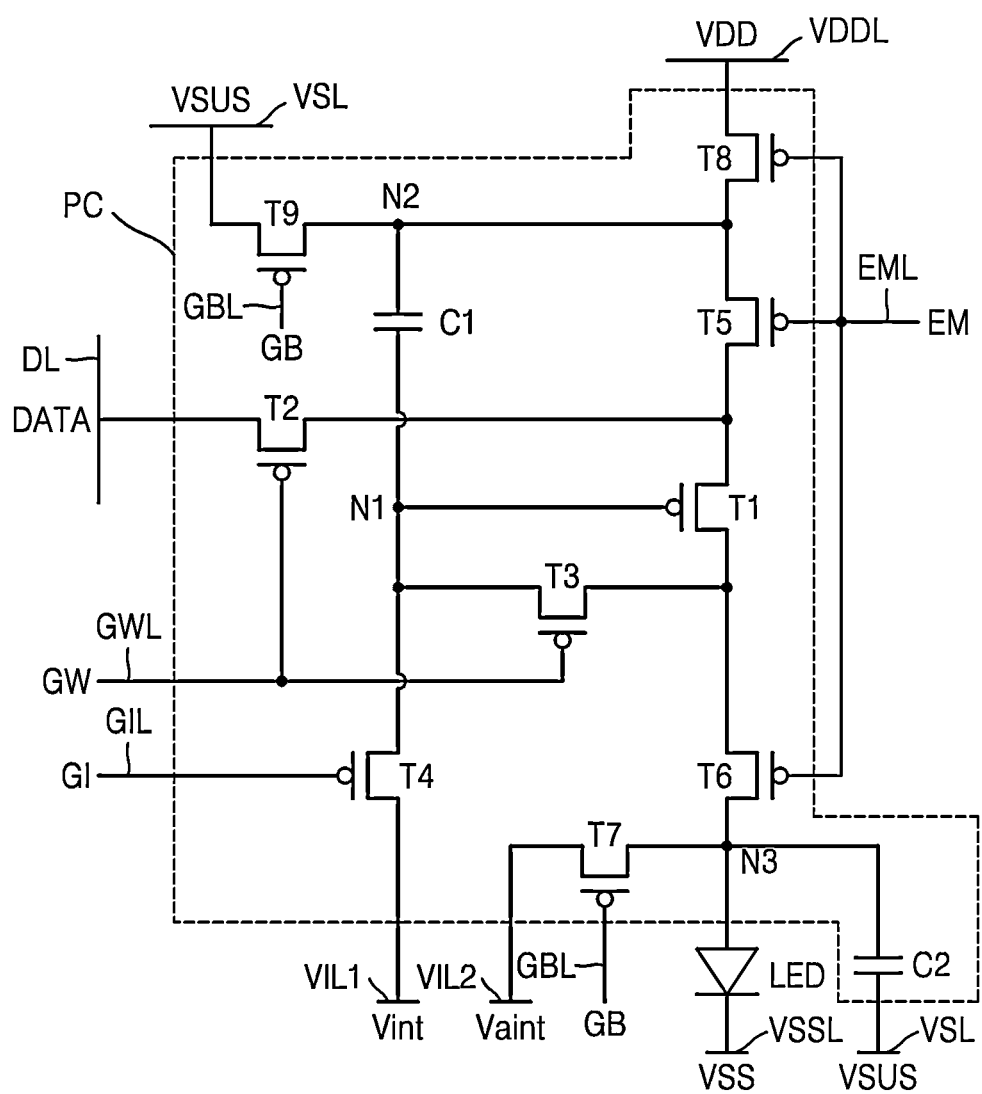
FIG. 4 is an equivalent circuit diagram of a pixel according to an embodiment.
Figure 5:
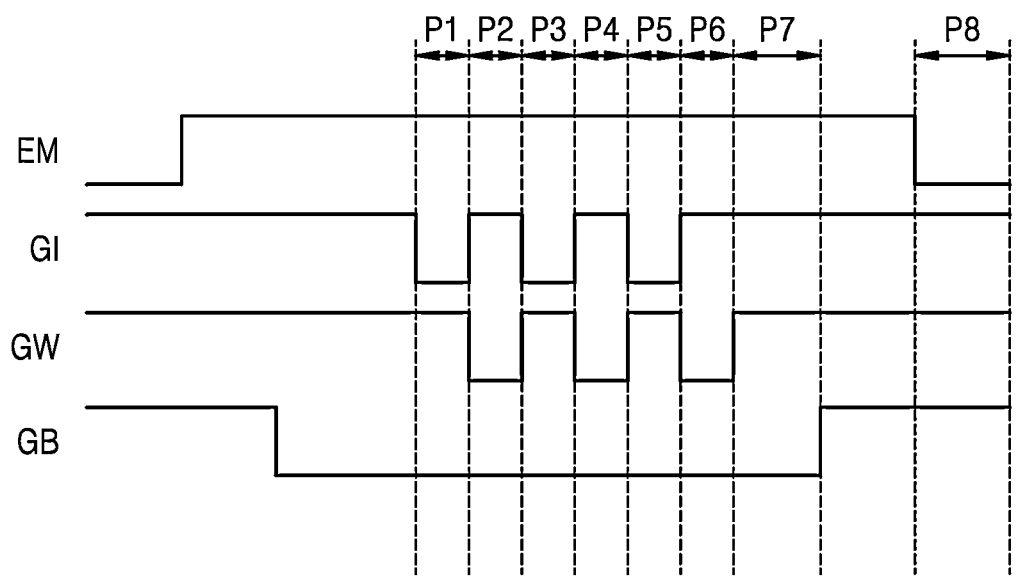
FIG. 5 is a diagram illustrating signals for describing an operation of the pixel illustrated in FIG. 4.
Figure 6:
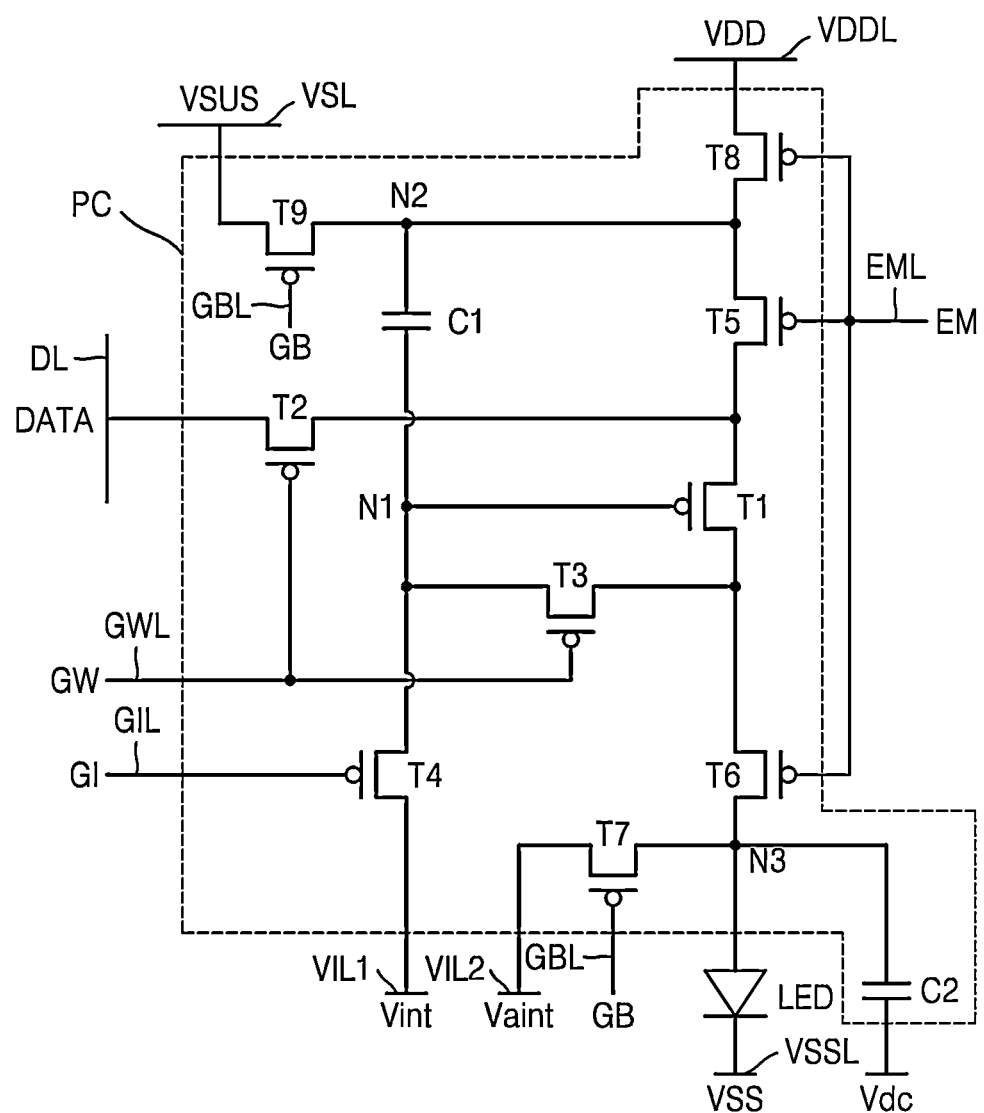
FIG. 6 is an equivalent circuit diagram of a pixel according to an embodiment.

FIG. 4 is an equivalent circuit diagram of a pixel according to an embodiment. FIG. 5 is a diagram illustrating signals for describing an operation of the pixel illustrated in FIG. 4. FIG. 6 is an equivalent circuit diagram of a pixel according to an embodiment.

Referring to FIG. 4, a pixel PX may include a light-emitting element LED and a pixel circuit PC connected to the light-emitting element LED. The pixel circuit PC may include first to ninth transistors T1, T2, T3, T4, T5, T6, T7, T8, and T9, a first capacitor C1, and a second capacitor C2. The first transistor T1 may be a driving transistor configured to output a driving current corresponding to a data signal, and the second to ninth transistors T2 to T9 may be switching transistors configured to transmit signals. A first terminal (first electrode) and a second terminal (second electrode) of each of the first to ninth transistors T1 to T9 may be a source or a drain according to voltages of the first terminal and the second terminal. For example, according to the voltages of the first terminal and the second terminal, the first terminal may be a source and the second terminal may be drain, or the first terminal may be a drain and the second terminal may be a source. Hereinafter, a node to which a gate of the first transistor T1 and a first electrode of the first capacitor C1 are connected may be defined as a first node N1, and a node to which a second electrode of the first capacitor C1 is connected may be defined as a second node N2.

The pixel PX may be connected to a first gate line GWL configured to transmit a first gate signal GW, a second gate line GIL configured to transmit a second gate signal GI, a third gate line EML configured to transmit a third gate signal EM, a fourth gate line GBL configured to transmit a fourth gate signal GB, and a data line DL configured to transmit a data signal DATA. Because light emission from the pixel PX is controlled by the third gate signal EM, the third gate signal EM may be referred to as an emission control signal, and the third gate line EML may be referred to as an emission control line.

The pixel PX may be connected to a first driving voltage line VDDL configured to transmit a first driving voltage VDD, a second driving voltage line VSSL configured to transmit a second driving voltage VSS, a first initialization voltage line VIL1 configured to transmit a first initialization voltage Vint, a second initialization voltage line VIL2 configured to transmit a second initialization voltage Vaint, and a sustain voltage line VSL configured to transmit a sustain voltage VSUS.

The first transistor T1 may be connected between the first driving voltage line VDDL and the light-emitting element LED. The first transistor T1 may be connected between the fifth transistor T5 and the sixth transistor T6. The first transistor T1 may be electrically connected to the first driving voltage line VDDL via the fifth transistor T5 and the eighth transistor T8 and may be electrically connected to the light-emitting element LED via the sixth transistor T6. The gate of the first transistor T1 may be connected to a second terminal of the second transistor T2, a second terminal of the third transistor T3, a first terminal of the fourth transistor T4, and the first capacitor C1. A first terminal of the first transistor T1 may be connected to a second terminal of the fifth transistor T5, and a second terminal of the first transistor T1 may be connected to a first terminal of the third transistor T3 and a first terminal of the sixth transistor T6. The first transistor T1 may be configured to control the amount of a driving current flowing to the light-emitting element LED by receiving the data signal DATA in response to a switching operation of the second transistor T2.

The second transistor T2 may be connected between the data line DL and the first terminal of the first transistor T1. The second transistor T2 may include a gate connected to the first gate line GWL, and the second transistor T2 may include a first terminal connected to the data line DL and a second terminal. The second terminal of the second transistor T2 may be connected to the first terminal of the first transistor T1 and the second terminal of the fifth transistor T5. The second transistor T2 may be turned on by the first gate signal GW transmitted through the first gate line GWL. In the ON state, the second transistor T2 may be configured to electrically connect the data line DL to the first terminal of the first transistor T1 and transmit, to the first terminal of the first transistor T1, the data signal DATA transmitted through the data line DL.

The third transistor T3 may be connected between the second terminal and the gate of the first transistor T1. The third transistor T3 may include a gate connected to the first gate line GWL, a first terminal, and a second terminal connected to the first node N1. The first terminal of the third transistor T3 may be connected to the second terminal of the first transistor T1 and the first terminal of the sixth transistor T6. The second terminal of the third transistor T3 may be connected to the gate of the first transistor T1, the first terminal of the fourth transistor T4, and the first capacitor C1. The third transistor T3 may be turned on by the first gate signal GW transmitted through the first gate line GWL and may diode-connect the first transistor T1 to compensate for a threshold voltage of the first transistor T1.

The fourth transistor T4 may be connected between the gate of the first transistor T1 and the first initialization voltage line VIL1. The fourth transistor T4 may include a gate connected to the second gate line GIL, the first terminal connected to the first node N1, and a second terminal connected to the first initialization voltage line VIL1. The first terminal of the fourth transistor T4 may be connected to the gate of the first transistor T1, the second terminal of the third transistor T3, and the first capacitor C1. The fourth transistor T4 may be turned on by the second gate signal GI transmitted through the second gate line GIL and may be configured to transmit, to the gate of the first transistor T1, the first initialization voltage Vint transmitted through the first initialization voltage line VIL1.

The fifth transistor T5 may be connected between the first driving voltage line VDDL and the first transistor T1. The fifth transistor T5 may be connected between the eighth transistor T8 and the first transistor T1. The fifth transistor T5 may include a gate connected to the third gate line EML, a first terminal connected to the second node N2, and the second terminal. The first terminal of the fifth transistor T5 may be connected to a second terminal of the eighth transistor T8, a first terminal of the ninth transistor T9, and the first capacitor C1. The second terminal of the fifth transistor T5 may be connected to the second terminal of the second transistor T2 and the first terminal of the first transistor T1.

The sixth transistor T6 may be connected between the first transistor T1 and the light-emitting element LED. The sixth transistor T6 may include a gate connected to the third gate line EML, the first terminal, and a second terminal connected to a third node N3. The first terminal of the sixth transistor T6 may be connected to the second terminal of the first transistor T1 and the first terminal of the third transistor T3. The second terminal of the sixth transistor T6 may be connected to a first terminal of the seventh transistor T7, a first electrode of the light-emitting element LED, and the second capacitor C2.

The eighth transistor T8 may be connected between the first driving voltage line VDDL and the fifth transistor T5. The eighth transistor T8 may include a gate connected to the third gate line EML, a first terminal connected to the first driving voltage line VDDL, and the second terminal connected to the first terminal of the fifth transistor T5. The second terminal of the eighth transistor T8 may be connected to the first terminal of the ninth transistor T9 and the first capacitor C1.

The fifth transistor T5, the sixth transistor T6, and the eighth transistor T8 may be simultaneously turned on by the third gate signal EM transmitted through the third gate line EML and may form a current path such that a driving current flows from the first driving voltage line VDDL to the light-emitting element LED.

The seventh transistor T7 may be connected between the light-emitting element LED and the second initialization voltage line VIL2. The seventh transistor T7 may be connected between the sixth transistor T6 and the second initialization voltage line VIL2. The seventh transistor T7 may include a gate connected to the fourth gate line GBL, the first terminal connected to the third node N3, and a second terminal connected to the second initialization voltage line VIL2. The first terminal of the seventh transistor T7 may be connected to the second terminal of the sixth transistor T6, the first electrode of the light-emitting element LED, and the second capacitor C2. The seventh transistor T7 may be turned on by the fourth gate signal GB transmitted through the fourth gate line GBL and may be configured to transmit, to the third node N3, the second initialization voltage Vaint transmitted through the second initialization voltage line VIL2.

The ninth transistor T9 may be connected between the sustain voltage line VSL and the second node N2. The eighth transistor T8 may include a gate connected to the fourth gate line GBL, a first terminal connected to the second node N2, and a second terminal connected to the sustain voltage line VSL. The first terminal of the ninth transistor T9 may be connected to the first terminal of the fifth transistor T5, the second terminal of the eighth transistor T8, and the first capacitor C1. The ninth transistor T9 may be turned on by the fourth gate signal GB transmitted through the fourth gate line GBL and may be configured to transmit, to the second node N2, the sustain voltage VSUS transmitted through the sustain voltage line VSL.

The first capacitor C1 may be connected between the first node N1 and the second node N2. The first electrode of the first capacitor C1 may be connected to the gate of the first transistor T1, the second terminal of the third transistor T3, and the first terminal of the fourth transistor T4. The second electrode of the first capacitor C1 may be connected to the first terminal of the fifth transistor T5, the second terminal of the eighth transistor T8, and the first terminal of the ninth transistor T9. The first capacitor C1 may be a storage capacitor and may store the threshold voltage of the first transistor T1 and a voltage corresponding to the data signal DATA.

The second capacitor C2 may be connected between the first electrode of the light-emitting element LED and the sustain voltage line VSL. A first electrode of the second capacitor C2 may be connected to the first electrode of the light-emitting element LED, the second terminal of the sixth transistor T6, and the first terminal of the seventh transistor T7. A second electrode of the second capacitor C2 may be connected to the sustain voltage line VSL. The second capacitor C2 may store and maintain a voltage corresponding to a difference between voltages of the first electrode of the light-emitting element LED and the sustain voltage line VSL, thereby preventing an increase in black luminance when the sixth transistor T6 is turned off.

The light-emitting element LED may be connected to the first transistor T1 through the sixth transistor T6. The light-emitting element LED may include the first electrode (pixel electrode, anode, or the like) and the second electrode (cathode). The first electrode of the light-emitting element LED may be connected to the second terminal of the sixth transistor T6, the first terminal of the seventh transistor T7, and the second capacitor C2. The second electrode of the light-emitting element LED may be connected to the second driving voltage line VSSL that provides the second driving voltage VSS.

The pixel PX may be configured to perform initialization, threshold voltage compensation, data writing, and light emission operations during one frame. The light-emitting element LED may be further initialized before emitting light.

Each of the first gate signal GW, the second gate signal GI, the third gate signal EM, and the fourth gate signal GB may have a low level voltage (first level voltage) during a period of one frame and may have a high level voltage (second level voltage) during another period of one frame. In this case, for example, the low level voltage may be a gate-on voltage that turns on a transistor, and the high level voltage may be a gate-off voltage that turns off the transistor.

A first period P1, a third period P3, and a fifth period P5 may be initialization periods for initializing the gate of the first transistor T1 and the first electrode of the light-emitting element LED.

In each of the first period P1, the third period P3, and the fifth period P5, the gate driving circuit GDC may supply (transmit) the second gate signal GI of a gate-on voltage to the second gate line GIL, supply the fourth gate signal GB of a gate-on voltage to the fourth gate line GBL, supply the first gate signal GW of a gate-off voltage to the first gate line GWL, and supply the third gate signal EM of a gate-off voltage to the third gate line EML. The fourth transistor T4 may be turned on by the second gate signal GI, and the seventh transistor T7 and the ninth transistor T9 may be turned on by the fourth gate signal GB. By the turned-on ninth transistor T9 and fourth transistor T4, the gate of the first transistor T1 may be initialized to the first initialization voltage Vint, and a voltage corresponding to a difference (VSUS−Vint) between the sustain voltage VSUS and the first initialization voltage Vint may be stored in the first capacitor C1. The first electrode of the light-emitting element LED may be initialized to the second initialization voltage Vaint by the turned-on seventh transistor T7.

A second period P2, a fourth period P4, and a sixth period P6 may be a compensation period for compensating for the threshold voltage of the first transistor T1 and be a writing period for supplying a data signal to a pixel.

In each of the second period P2, the fourth period P4, and the sixth period P6, the gate driving circuit GDC may supply the first gate signal GW of a gate-on voltage to the first gate line GWL, supply the fourth gate signal GB of a gate-on voltage to the fourth gate line GBL, supply the second gate signal GI of a gate-off voltage to the second gate line GIL, and supply the third gate signal EM of a gate-off voltage to the third gate line EML.

The second transistor T2 and the third transistor T3 may be turned on by the first gate signal GW, and the seventh transistor T7 and the ninth transistor T9 may be turned on by the fourth gate signal GB. A data voltage Vdata corresponding to the data signal DATA may be supplied to the first terminal of the first transistor T1 by the turned-on second transistor T2. By the turned-on third transistor T3, the first transistor T1 may be diode-connected, a gate voltage Vg of the first transistor T1 may become equal to a difference (Vg=Vdata+Vth where Vth has a negative (−) value) between the data voltage Vdata and a threshold voltage Vth of the first transistor T1, and a voltage (VSUS−(Vdata+Vth)) corresponding to a difference between the sustain voltage VSUS and the gate voltage Vg of the first transistor T1 may be stored in the first capacitor C1 such that the threshold voltage Vth of the first transistor T1 may be compensated for.

The data signal DATA supplied in the second period P2 and the fourth period P4 may be a data signal supplied to a pixel in another row and may be used to compensate for the threshold voltage of the first transistor T1. The data signal DATA supplied in the sixth period P6 may be a data signal supplied to a pixel in a current row (a corresponding row) for light emission.

As initialization and threshold voltage compensation are alternately repeated during the first period P1 to the sixth period P6, an on-bias voltage is applied to the first transistor T1 a certain number of times to shift the threshold voltage of the first transistor T1 in a certain direction such that hysteresis may be compensated for. The on-bias voltage may be a difference between voltages of the gate and a source (first terminal) of the first transistor T1, which turn on the first transistor T1.

A seventh period P7 may be an initialization period for initializing the first electrode of the light-emitting element LED.

In the seventh period P7, the gate driving circuit GDC may supply the fourth gate signal GB of a gate-on voltage to the fourth gate line GBL, supply the first gate signal GW of a gate-off voltage to the first gate line GWL, supply the second gate signal GI of a gate-off voltage to the second gate line GIL, and supply the third gate signal EM of a gate-off voltage to the third gate line EML. The seventh transistor T7 and the ninth transistor T9 may be turned on by the fourth gate signal GB. The first electrode of the light-emitting element LED may be initialized to the second initialization voltage Vaint by the turned-on seventh transistor T7.

In some aspects, the supplying of the sustain voltage VSUS to the second node N2, that is, the second electrode of the first capacitor C1 during the first period P1 to the seventh period P7, may improve luminance uniformity (e.g., long range uniformity (LRU)) of the display apparatus caused by a voltage drop of the first driving voltage line VDDL.

An eighth period P8 may be a light emission period in which the light-emitting element LED emits light.

In the eighth period P8, the gate driving circuit GDC may supply the third gate signal EM of a gate-on voltage to the third gate line EML, and the gate driving circuit GDC may supply the first gate signal GW, the second gate signal GI, and the fourth gate signal GB of a gate-off voltage to the first gate line GWL, the second gate line GIL, and the fourth gate line GBL, respectively.

The fifth transistor T5, the sixth transistor T6, and the eighth transistor T8 may be turned on by the third gate signal EM. By the turned-on eighth transistor T8 and the fifth transistor T5, the first driving voltage VDD may be supplied to the first terminal of the first transistor T1, and a voltage of the second node N2 may be changed from the sustain voltage VSUS to the first driving voltage VDD. By coupling of the first capacitor C1, the gate voltage Vg of the first transistor T1 may be changed to a value (Vg=(Vdata+Vth)−(VSUS−VDD)) obtained by subtracting the amount of voltage change of the second node N2 from a voltage (Vdata−Vth) in the sixth period P6. Accordingly, the first transistor T1 may output a driving current (Id∝(Vgs−Vth)$^2$, Vgs−Vth= (Vdata+Vth)−(VSUS−VDD)−VDD−Vth=Vdata−VSUS) having a magnitude corresponding to a voltage (Vgs−Vth) obtained by subtracting the threshold voltage Vth of the first transistor T1 from a gate-source voltage Vgs, the driving current may flow to the light-emitting element LED through the turned-on sixth transistor T6, and the light-emitting element LED may emit light with a luminance corresponding to the magnitude of the driving current.

FIG. 4 illustrates that the second electrode of the second capacitor C2 of the pixel PX is connected to the sustain voltage line VSL and receives the sustain voltage VSUS, but one or more embodiments are not limited thereto. In an embodiment, as illustrated in FIG. 6, a constant voltage Vdc that is different from the sustain voltage VSUS may be supplied to the second electrode of the second capacitor C2. For example, the second electrode of the second capacitor C2 may be connected to the first driving voltage line VDDL and receive the first driving voltage VDD, may be connected to the first initialization voltage line VIL1 and receive the first initialization voltage Vint, or may be connected to the second initialization voltage line VIL2 and receive the second initialization voltage Vaint.

Figure 7:
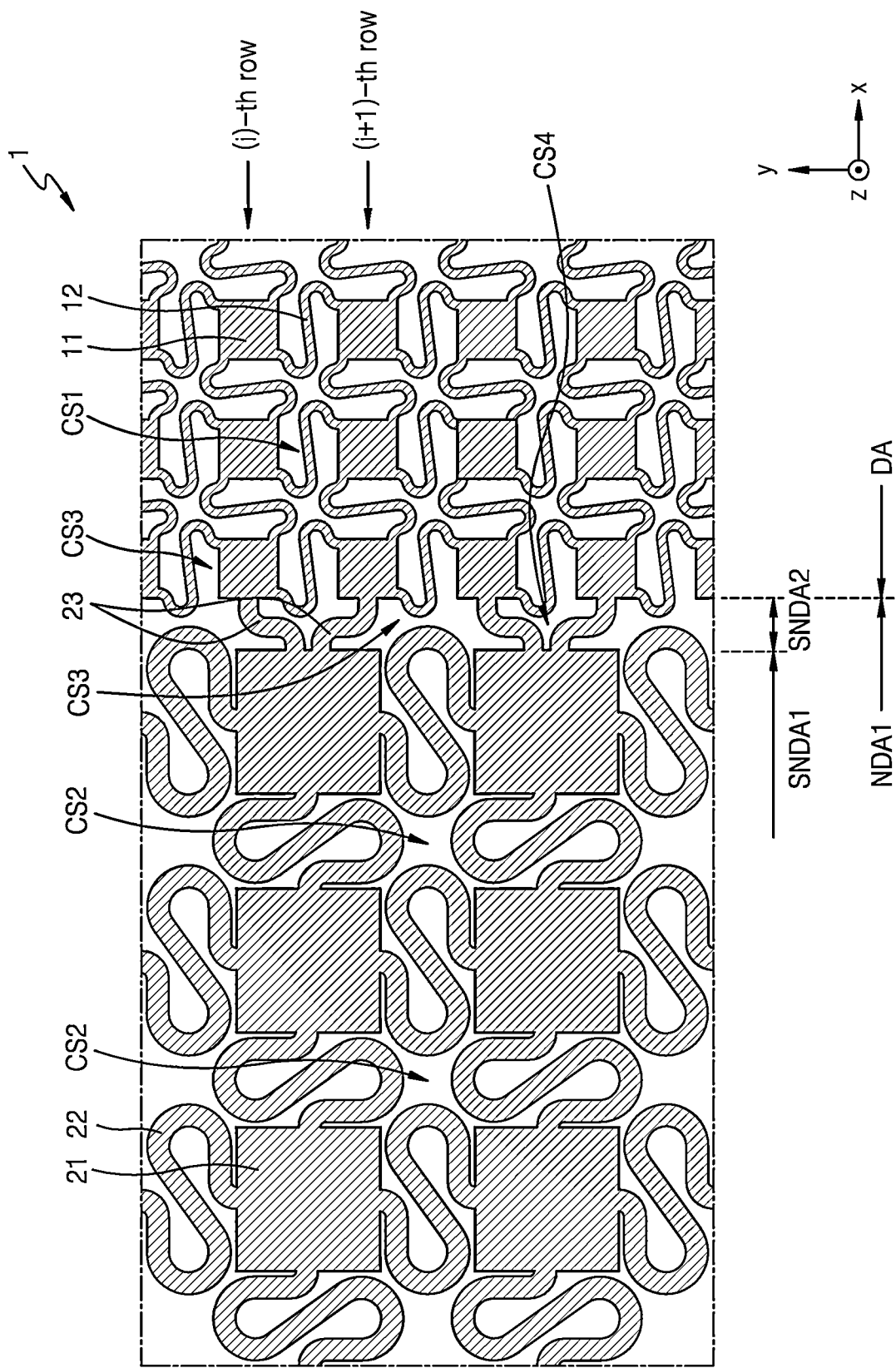
FIG. 7 is an enlarged plan view of an area IV of FIG. 3 as a portion of a display apparatus, according to an embodiment.

FIG. 7 is an enlarged plan view of an area IV of FIG. 3 as a portion of the display apparatus 1, according to an embodiment.

Referring to FIG. 7, the display apparatus 1 may include first island portions 11 that are spaced apart from each other in a first direction (e.g., an x-direction or −x direction) and/or a second direction (e.g., a y-direction or −y direction) in the display area DA, and the display apparatus 1 may include first bridge portions 12 that connect adjacent first island portions 11 to each other.

The first bridge portions 12 may be spaced apart from each other by a first opening CS1 between the first bridge portions 12. A first bridge portion 12 may have a curved shape. For example, as illustrated in FIG. 7, the first bridge portion 12 may approximately have a shape of the letter "S." The term "approximately" as used herein is inclusive of the stated value or characteristic and include a suitable range of deviation for the particular value or characteristic as determined by one of ordinary skill in the art.

Each first island portion 11 may be connected to a plurality of first bridge portions 12. For example, a first island portion 11 may be connected to four first bridge portions 12. In the example, two first bridge portions 12 may be arranged on both sides of the first island portion 11 in the first direction (e.g., the x-direction or −x direction), and the other two first bridge portions 12 may be arranged on both sides of the first island portion 11 in the second direction (e.g., the y-direction or −y direction). The four first bridge portions 12 may be respectively connected to four sides of the first island portion 11. In some embodiments, for four bridge portions 12 connected to a first island portion 11, each of the four first bridge portions 12 may be adjacent to a corner of the first island portion 11. However, aspects of the present disclosure are not limited thereto, and in some embodiments, one or more of the four first bridge portions 12 may be offset from a corner of the first island portion 11 (e.g., located at a position between the corner and a central portion of a side of the first island portion 11).

The display apparatus 1 may include second island portions 21 that are spaced apart from each other in the first direction (e.g., the x-direction or −x direction) and the second direction (e.g., the y-direction or −y direction) in a non-display area, e.g., the first non-display area NDA1 illustrated in FIG. 7, and the display apparatus 1 may include second bridge portions 22 that connect adjacent second island portions 21.

The second bridge portions 22 may be spaced apart from each other by a second opening CS2 between the second bridge portions 22. A second bridge portion 22 may have a curved shape. For example, as illustrated in FIG. 7, the second bridge portion 22 may approximately have a shape of the letter "S."

A size and/or width of the second bridge portion 22 may be different from a size and/or width of the first bridge portion 12. For example, the size and/or width of the second bridge portion 22 may be greater than the size and/or width of the first bridge portion 12. A radius of curvature of a round portion of the second bridge portion 22 may be different from a radius of curvature of a round portion of the first bridge portion 12. For example, the radius of curvature of the round portion of the second bridge portion 22 may be greater than the radius of curvature of the round portion of the first bridge portion 12. Embodiments of the present disclosure are not limited thereto, and in some embodiments, (not illustrated), a radius of curvature of a round portion of a second bridge portion 22 may be approximately equal to a radius of curvature of a round portion of a first bridge portion 12.

Each second island portion 21 may be connected to a plurality of second bridge portions 22. For example, each second island portion 21 may be connected to four second bridge portions 22. In the example, two second bridge portions 22 may be arranged on both sides of the second island portion 21 in the first direction (e.g., the x-direction or −x direction), and the other two second bridge portions 22 may be arranged on both sides of the second island portion 21 in the second direction (e.g., the y-direction or −y direction). In an embodiment, the four second bridge portions 22 may be respectively connected to four sides of the second island portion 21. In some embodiments, for four second bridge portions 22 connected to a second island portion 21, each of the four second bridge portions 22 may be connected to a central portion of a side of the second island portion 21. However, aspects of the present disclosure are not limited thereto, and in some embodiments, one or more of the four second bridge portions 22 may be offset from a central portion of a side of the second island portion 21 (e.g., located at a position between the central portion and a corner of the second island portion 21).

Second island portions 21 in a row arranged in the first non-display area NDA1 may correspond to first island portions 11 in a plurality of rows arranged in the display area DA. For example, second island portions 21 in a row arranged in the first non-display area NDA1 may correspond to first island portions 11 arranged in an (i)-th row and first island portions 11 arranged in a (i+1)-th row of the display area DA (where i is a positive number greater than 0). In another embodiment, second island portions 21 in one row may correspond to n rows of the first island portions 11 (where n is a positive number of 3 or more). Accordingly, for example, an area occupied by a row of second island portions 21 may be larger than an area occupied by a row of first island portions 11.

The non-display area, for example, the first non-display area NDA1, may include a first sub-non-display area SNDA1 in which the second island portions 21 and the second bridge portions 22 are arranged, and the non-display area may include a second sub-non-display area SNDA2 between the first sub-non-display area SNDA1 and the display area DA. Third bridge portions 23 that connect the display area DA to the first sub-non-display area SNDA1 may be arranged in the second sub-non-display area SNDA2. One end of a third bridge portion 23 may be connected to a second island portion 21, and the other end of the third bridge portion 23 may be connected to a first island portion 11. For example, one end of the third bridge portion 23 may be connected to a central portion of one side of the second island portion 21, and the other end of the third bridge portion 23 may be connected to a central portion of one side of the first island portion 11.

The third bridge portion 23 may have a curved shape. In an embodiment, a shape of the third bridge portion 23 may be different from a shape of each of the first bridge portion 12 and the second bridge portion 22. A width of the third bridge portion 23 may be different from a width of the first bridge portion 12 and a width of the second bridge portion 22. The width of the third bridge portion 23 may be greater than the width of the first bridge portion 12 and less than the width of the second bridge portion 22. A third opening CS3 and a fourth opening CS4 having different shapes may be alternately arranged between the third bridge portions 23 in the second direction (e.g., the y-direction or −y direction). Embodiments of the present disclosure are not limited thereto, and in some embodiments, (not illustrated), one or more features (e.g., shape, radius of curvature, width, length, or the like) of a third bridge portion 23 may be approximately the same as one or more corresponding features of a first bridge portion 12 and/or a second bridge portion 22.

FIG. 7 illustrates that the second island portion 21 and the second bridge portion 22 in the non-display area, for example, the first non-display area NDA1, have the same shape as the first island portion 11 and the first bridge portion 12 in the display area DA, respectively. In another embodiment, the second island portion 21 and the second bridge portion 22 in the non-display area may have different shapes from the first island portion 11 and the first bridge portion 12 in the display area DA, respectively.

Figure 8:
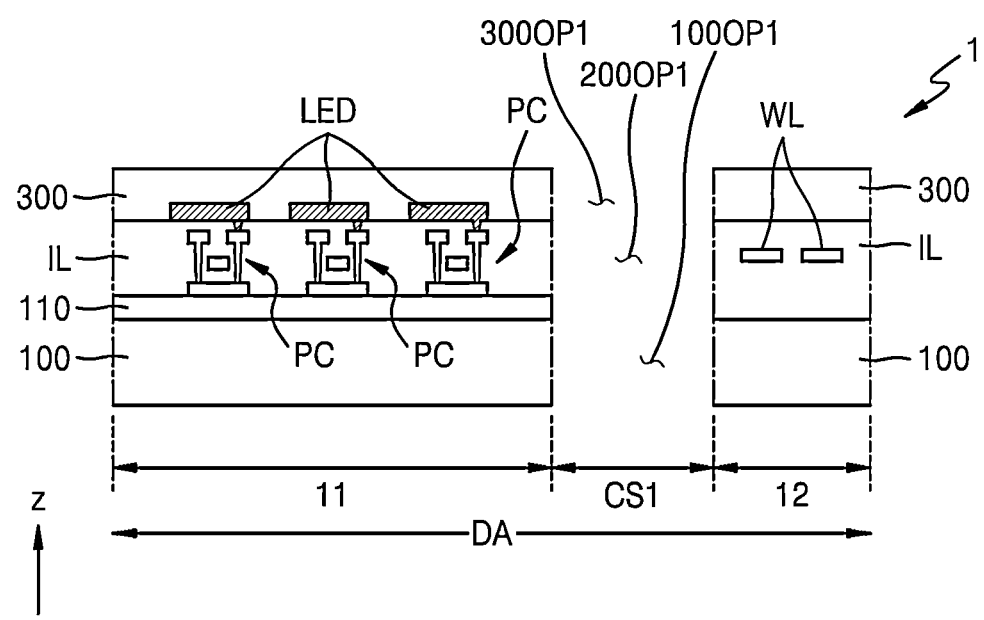
FIG. 8 is a schematic cross-sectional view of a first island portion and a first bridge portion arranged in a display area of a display apparatus, according to an embodiment.

FIG. 8 is a schematic cross-sectional view of the first island portion 11 and the first bridge portion 12 arranged in the display area DA of the display apparatus 1, according to an embodiment.

Referring to FIG. 8, the first island portion 11 and the first bridge portion 12 arranged in the display area DA may be spaced apart from each other, with the first opening CS1 between the first island portion 11 and the first bridge portion 12. Light-emitting elements LED and a pixel circuit PC electrically connected to the light-emitting elements LED may be arranged in the first island portion 11, and conductive lines WL electrically connected to pixel circuits PC respectively arranged in adjacent first island portions 11 may be arranged in the first bridge portion 12.

With respect to the first island portion 11, a barrier layer 110 including an inorganic insulating material may be disposed on the substrate 100 and the pixel circuit PC may be disposed on the barrier layer 110. An insulating layer IL including an inorganic insulating material and/or an organic insulating material may be between the pixel circuit PC and the light-emitting element LED. The light-emitting element LED may be disposed on the insulating layer IL and may be electrically connected to a pixel circuit PC corresponding to the light-emitting element LED. The light-emitting elements LED may emit light of different colors or light of the same color. In an embodiment, the light-emitting elements LED may each emit red, green, or blue light. In some embodiments, the light-emitting elements LED may emit white light. In another embodiment, the light-emitting elements LED may each emit red, green, blue, or white light.

The substrate 100 may include polymer resin such as, for example, polyethersulfone, polyarylate, polyether imide, polyethylene naphthalate, polyethylene terephthalate, polyphenylene sulfide, polyimide, polycarbonate, cellulose triacetate, or cellulose acetate propionate. In an embodiment, the substrate 100 may include a single layer including the aforementioned polymer resin. In another embodiment, the substrate 100 may have a multilayer structure including a base layer including the aforementioned polymer resin and a barrier layer including an inorganic insulating material. For example, the substrate 100 may have a structure in which a first base layer, a barrier layer, and a second base layer are sequentially stacked. The substrate 100 may be flexible, rollable, or bendable.

In an embodiment, FIG. 8 illustrates that three pixel circuits PC are arranged in the first island portion 11, and three light-emitting elements LED are respectively connected to the three pixel circuits PC, but one or more embodiments are not limited thereto. In another embodiment, the number of pixel circuits PC and the number of light-emitting elements LED arranged in the first island portion 11 may be one, two, four, or more.

An encapsulation layer 300 may be disposed on the light-emitting elements LED and may protect the light-emitting elements LED from an external force and/or moisture penetration. The encapsulation layer 300 may include an inorganic encapsulation layer and/or an organic encapsulation layer. In some embodiments, the encapsulation layer 300 may have a structure in which an inorganic encapsulation layer including an inorganic insulating material, an organic encapsulation layer including an organic insulating material, and an inorganic encapsulation layer including an inorganic insulating material are stacked. In another embodiment, the encapsulation layer 300 may include an organic material such as, for example, resin. In some embodiments, the encapsulation layer 300 may include urethane epoxy acrylate. The encapsulation layer 300 may include a photosensitive material such as, for example, photoresist.

With respect to the first bridge portion 12, the insulating layer IL including an organic insulating material may be disposed on the substrate 100. Unlike the first island portion 11, the first bridge portion 12, which is relatively highly transformed when the display apparatus 1 is stretched, may not include a layer including an inorganic insulating material that is prone to cracks. For example, the first bridge portion 12 may be implemented such that the first bridge portion 12 does not include a layer including an inorganic insulating material that is prone to cracks.

In an embodiment, the substrate 100 corresponding to the first bridge portion 12 may have the same stacked structure as the substrate 100 corresponding to the first island portion 11. In an embodiment, the substrate 100 corresponding to the first bridge portion 12 and the substrate 100 corresponding to the first island portion 11 may be polymer resin layers formed together in the same process. In another embodiment, the substrate 100 corresponding to the first bridge portion 12 may have a stacked structure that is different from the stacked structure of the substrate 100 corresponding to the first island portion 11. In some embodiments, the substrate 100 corresponding to the first island portion 11 may have a multilayer structure including a base layer and a barrier layer, wherein the base layer includes polymer resin and the barrier layer includes an inorganic insulating material, and the substrate 100 corresponding to the first bridge portion 12 may have a structure of polymer resin layer without a layer including an inorganic insulating material.

The conductive lines WL of the first bridge portion 12 may be signal lines (e.g., gate lines, data lines, driving voltage lines, initialization voltage lines, voltage connection lines, or the like) capable of providing electrical signals to transistors included in the pixel circuits PC of the first island portion 11. The encapsulation layer 300 may also be arranged in the first bridge portion 12. In another embodiment, the encapsulation layer 300 may be omitted in the first bridge portion 12.

The substrate 100, the barrier layer 110, the insulating layer IL, and the encapsulation layer 300 may include openings corresponding to an area corresponding to the first island portion 11, an area corresponding to the first bridge portion 12, and the first opening CS1, respectively. Each of an opening 100OP1 of the substrate 100, an opening 200OP1 of the barrier layer 110 and the insulating layer IL, and an opening 300OP1 of the encapsulation layer 300 may overlap the first opening CS1 and may have a shape similar to the shape of the first opening CS1.

Figure 9:
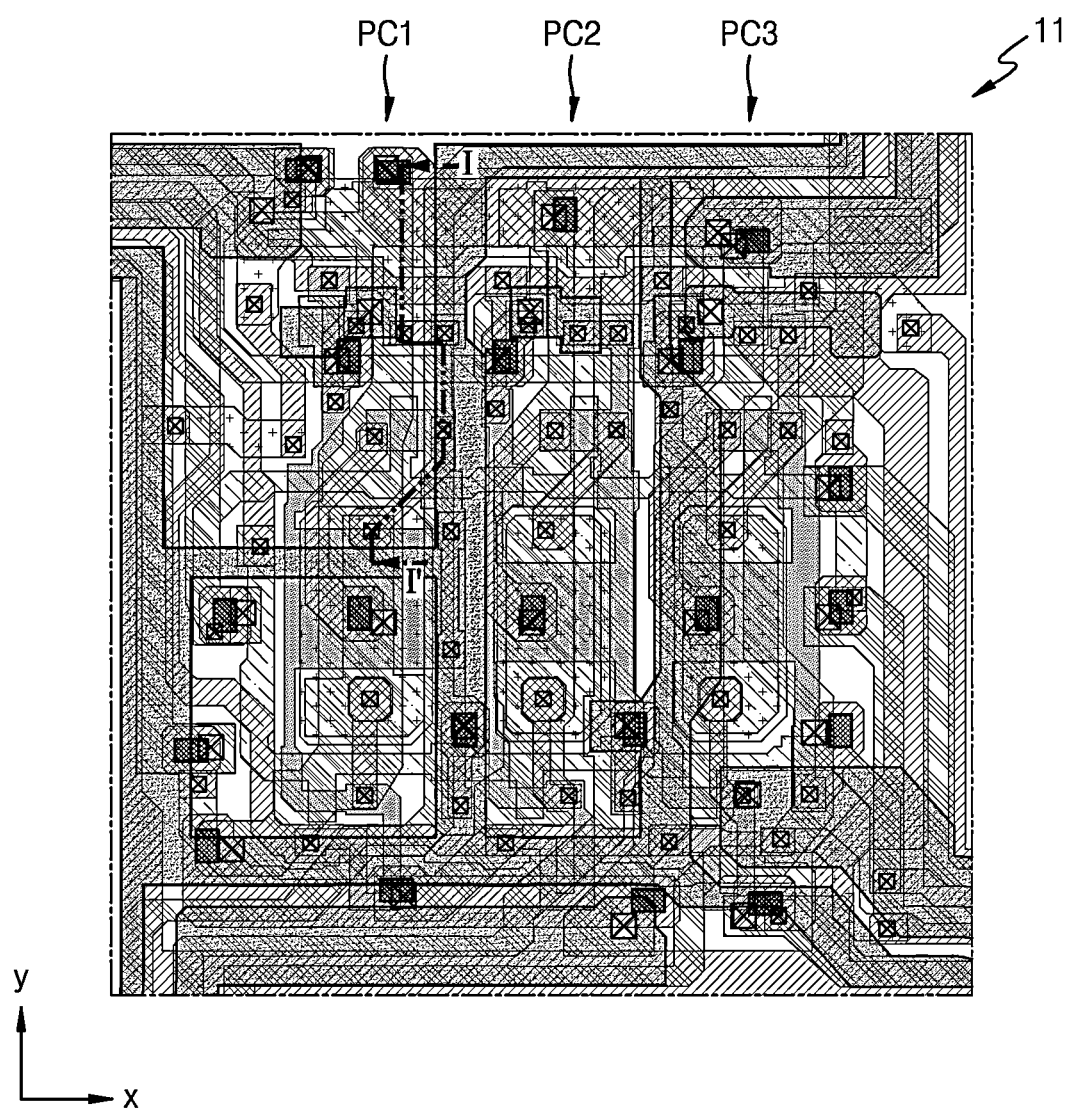
FIG. 9 is a schematic diagram of elements of pixel circuits arranged in a first island portion, according to an embodiment.
Figure 18:
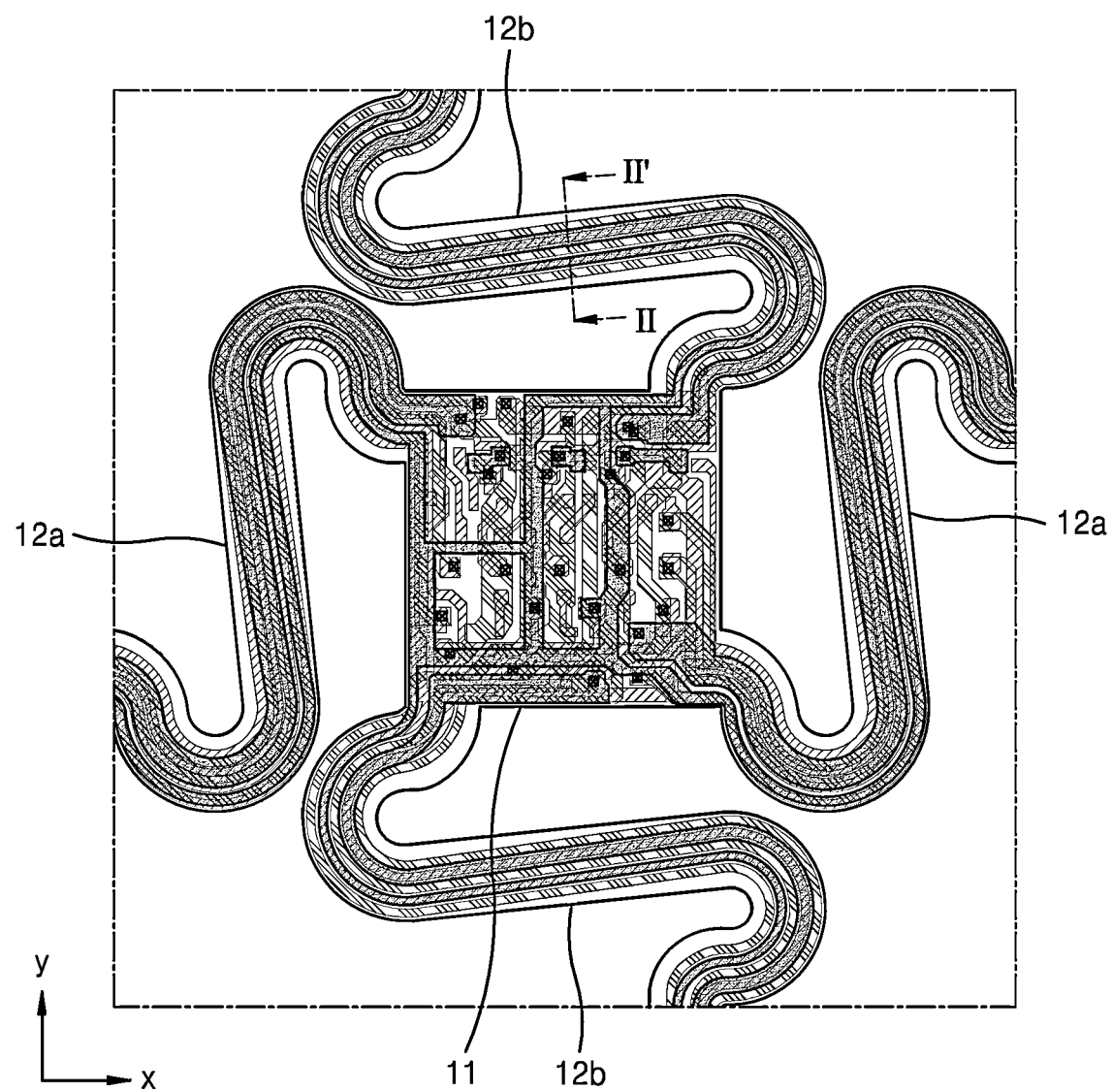
FIG. 18 is a schematic diagram illustrating stacking of conductive layers of FIGS. 15 to 17.
Figure 19:
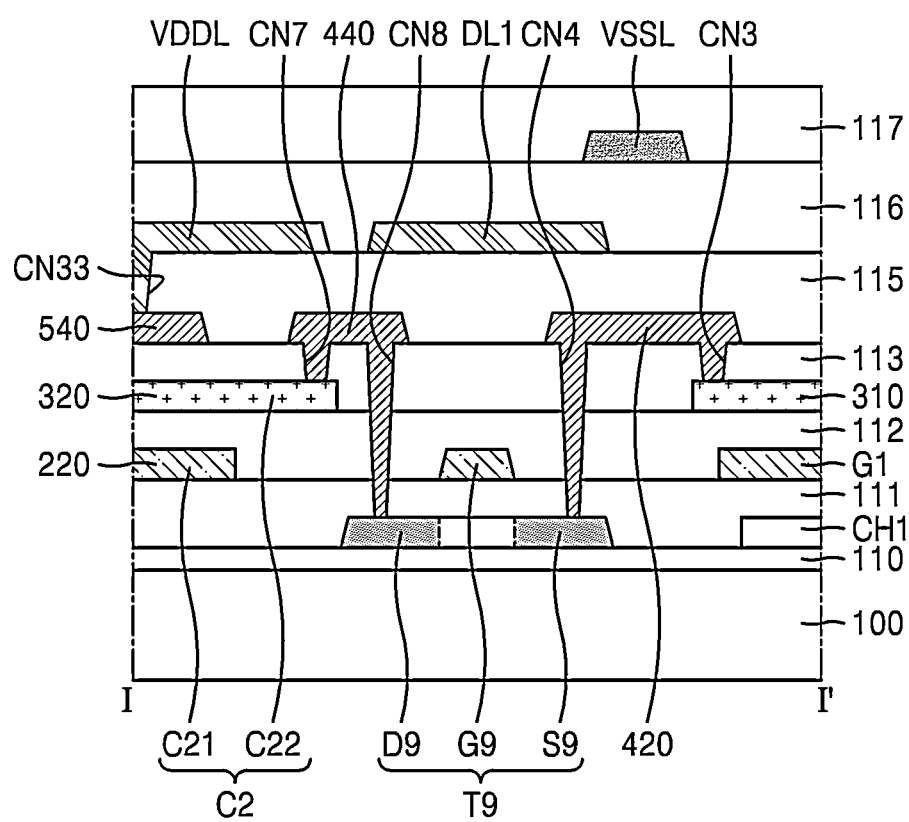
FIG. 19 is a cross-sectional view of the display apparatus taken along a line I-I' of FIG. 9.
Figure 20:
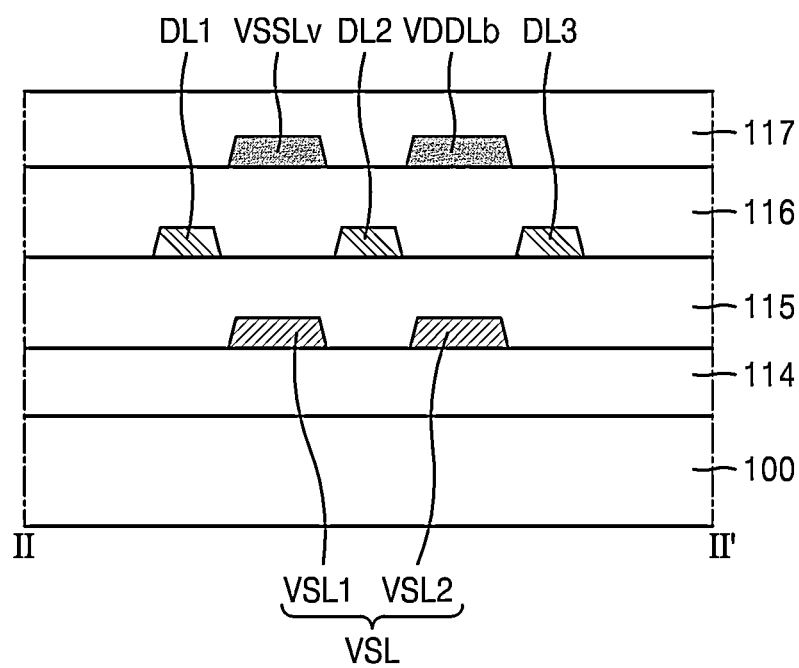
FIG. 20 is a cross-sectional view of the display apparatus taken along a line II-II' of FIG. 18.

FIG. 9 is a schematic diagram of elements of pixel circuits arranged in a first island portion 11, according to an embodiment. FIGS. 10 to 17 are schematic plan views (also referred to herein as schematic layout views) of elements of the pixel circuits illustrated in FIG. 9 by layer. FIG. 13 is a diagram of transistors and a capacitor of a first pixel circuit PC1. FIG. 18 is a schematic diagram illustrating stacking of conductive layers of FIGS. 15 to 17. FIG. 19 is a cross-sectional view of the display apparatus taken along a line I-I' of FIG. 9. FIG. 20 is a cross-sectional view of the display apparatus taken along a line II-II' of FIG. 18.

A plurality of first island portions 11 and a plurality of first bridge portions 12 that connect the first island portions 11 to each other may be defined in the display area DA, and the first bridge portions 12 may include horizontal bridge portions 12a extending in a first direction and vertical bridge portions 12b extending in a second direction.

As illustrated in FIG. 9, a first pixel circuit PC1, a second pixel circuit PC2, and a third pixel circuit PC3 of the first pixel PX1, the second pixel PX2, and the third pixel PX3 constituting the unit pixel PXu may be arranged in the first island portion 11. The first pixel circuit PC1 may be electrically connected to the light-emitting element LED that emits red light, the second pixel circuit PC2 may be electrically connected to the light-emitting element LED that emits green light, and the third pixel circuit PC3 may be electrically connected to the light-emitting element LED that emits blue light.

Conductive lines extending in the first direction may be arranged in the horizontal bridge portions 12a connected to the first island portions 11 that are adjacent in the first direction, and conductive lines extending in the second direction may be arranged in the vertical bridge portions 12b connected to the first island portions 11 that are adjacent in the second direction.

Hereinafter, conductive lines that extend in the first direction and are arranged in the first island portion 11 and/or the horizontal bridge portions 12a may also be referred to as horizontal conductive lines, horizontal voltage lines, or horizontal connection lines. Similarly, conductive lines that extend in the second direction and are arranged in the first island portion 11 and/or the vertical bridge portions 12b may also be referred to as vertical conductive lines, vertical voltage lines, or vertical connection lines. In this regard, the first direction has been described as a horizontal direction and the second direction as a vertical direction, but one or more embodiments are not limited thereto. According to a viewing direction of the display apparatus or the display panel, one of different directions orthogonal to each other may be referred to as the horizontal direction and the other may be referred to as the vertical direction. For example, conductive lines extending and being arranged in the first direction may be referred to as vertical conductive lines, and conductive lines extending and being arranged in the second direction may be referred as horizontal conductive lines.

The terms "horizontal" and "vertical" as used herein may refer to respective directions or elements (e.g., bridge portions, conductive lines, voltage lines, and the like) which may intersect or cross one another. For example, a direction or element described herein as "horizontal" may intersect or cross (e.g., at a 90 degree angle) a direction or element described herein as "vertical."

Hereinafter, for convenience of illustration and description, identification numbers are assigned to elements constituting the first pixel circuit PC1, the first pixel circuit PC1 will be mainly described, and descriptions of the same elements may equally apply to elements of the second pixel circuit PC2 and the third pixel circuit PC3. Hereinafter, descriptions are provided with reference to FIGS. 9 to 20 together.

Figure 10:
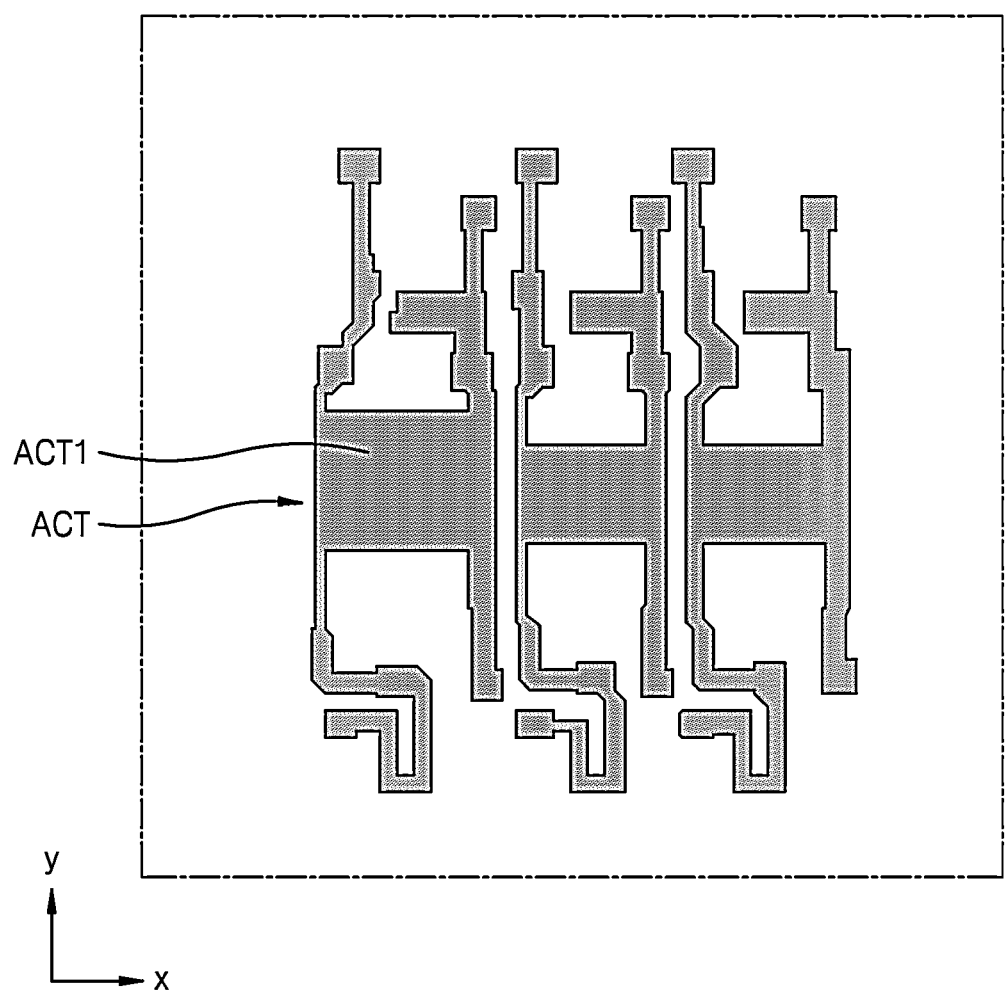
FIGS. 10 to 17 are schematic plan views of elements of the pixel circuits illustrated in FIG. 9 by layer.
Figure 11:
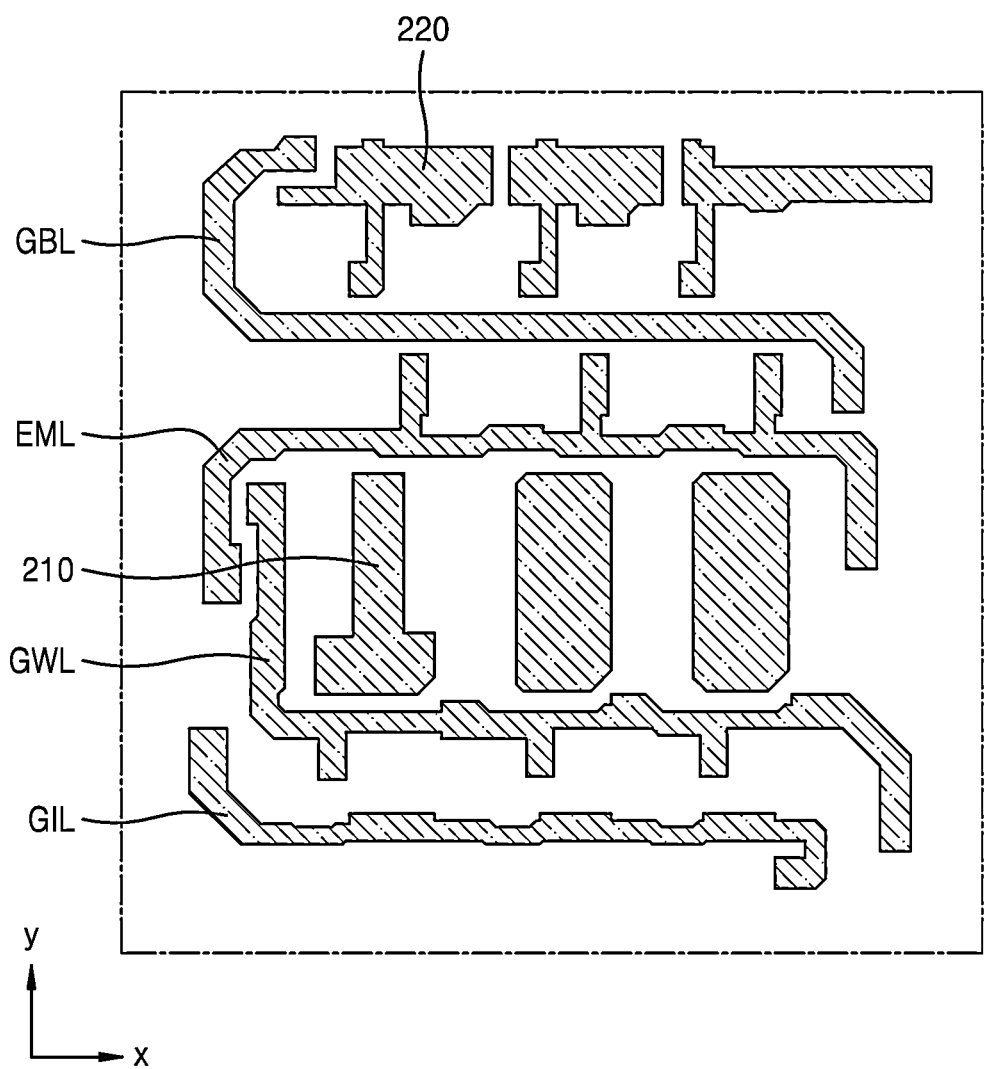

As illustrated in FIG. 10, a semiconductor layer ACT may be arranged in the first island portion 11. A barrier layer 110 (see FIG. 19) may be between a substrate 100 (see FIG. 19) and the semiconductor layer ACT. The semiconductor layer ACT may include a silicon semiconductor. The semiconductor layer ACT may include a channel region of each of the first to ninth transistors T1 to T9, and the semiconductor layer ACT may include a source region and a drain region on both sides of the channel region. In some cases, source regions or drain regions may be construed as source electrodes or drain electrodes of transistors, respectively.

Referring to FIG. 13, the semiconductor layer ACT may include a source region S1 and a drain region D1 of the first transistor T1, a source region S2 and a drain region D2 of the second transistor T2, a source region S3 and a drain region D3 of the third transistor T3, a source region S4 and a drain region D4 of the fourth transistor T4, a source region S5 and a drain region D5 of the fifth transistor T5, a source region S6 and a drain region D6 of the sixth transistor T6, a source region S7 and a drain region D7 of the seventh transistor T7, a source region S8 and a drain region D8 of the eighth transistor T8, and a source region S9 and a drain region D9 of the ninth transistor T9. The third transistor T3 and the fourth transistor T4 may each have two channel regions.

A first semiconductor layer ACT1, which is a portion of the semiconductor layer ACT including the source region S1, the drain region D1, and a channel region CHI (see FIG. 19) of the first transistor T1, may have a substantially square size and may have a different area (size) for each pixel. In an embodiment, as illustrated in FIG. 10, an area of the first semiconductor layer ACT1 of the first pixel circuit PC1 may be greater than an area of the first semiconductor layer ACT1 of the second pixel circuit PC2 and an area of the first semiconductor layer ACT1 of the third pixel circuit PC3.

A first insulating layer 111 (see FIG. 19) may be disposed on the barrier layer 110 and cover the semiconductor layer ACT, and a first conductive layer may be disposed on the first insulating layer 111. The first conductive layer may include a first electrode 210, a second electrode 220, the first gate line GWL, the second gate line GIL, the third gate line EML, and the fourth gate line GBL.

The first electrode 210 and the second electrode 220 may be provided as island types. Areas and shapes of the first electrode 210 and the second electrode 220 may be different for each pixel circuit. In an embodiment, an area of a first electrode 210 of the first pixel circuit PC1 may be less than an area of a first electrode 210 of the second pixel circuit PC2 and an area of a first electrode 210 of the third pixel circuit PC3.

The first gate line GWL, the second gate line GIL, the third gate line EML, and the fourth gate line GBL may extend in the first direction within the first island portion 11 and may not extend to the horizontal bridge portions 12a. Both end portions of each of the first gate line GWL, the second gate line GIL, the third gate line EML, and the fourth gate line GBL may be located at an edge within the first island portion 11.

The first conductive layer may include gates (gate electrodes) G1, G2, G3, G4, G5, G6, G7, G8, and G9 of the first to ninth transistors T1 to T9. The gate electrodes G1 to G9 may overlap channel regions of the semiconductor layer ACT.

Referring to FIG. 13, the first electrode 210 may include a gate electrode G1 of the first transistor T1. The gate electrode G1 may overlap the first semiconductor layer ACT1. Each of a gate electrode G2 of the second transistor T2 and a gate electrode G3 of the third transistor T3 may be a portion of the first gate line GWL overlapping the semiconductor layer ACT. The first gate line GWL may overlap the semiconductor layer ACT twice between the source region S3 and the drain region D3 of the third transistor T3, and the gate electrode G3 of the third transistor T3 may include two gate electrodes. That is, the two gate electrodes may be a first gate electrode G31 and a second gate electrode G32, which respectively overlap two channels.

A gate electrode G4 of the fourth transistor T4 may be a portion of the second gate line GIL overlapping the semiconductor layer ACT. The second gate line GIL may overlap the semiconductor layer ACT twice between the source region S4 and the drain region D4 of the fourth transistor T4, and the gate electrode G4 of the fourth transistor T4 may include two gate electrodes. That is, the two gate electrodes may be a first gate electrode G41 and a second gate electrode G42, which respectively overlap two channels. Each of a gate electrode G5 of the fifth transistor T5, a gate electrode G6 of the sixth transistor T6, and a gate electrode G8 of the eighth transistor T8 may be a portion of the third gate line EML overlapping the semiconductor layer ACT. Each of a gate electrode G7 of the seventh transistor T7 and a gate electrode G9 of the ninth transistor T9 may be a portion of the fourth gate line GBL overlapping the semiconductor layer ACT.

Figure 12:
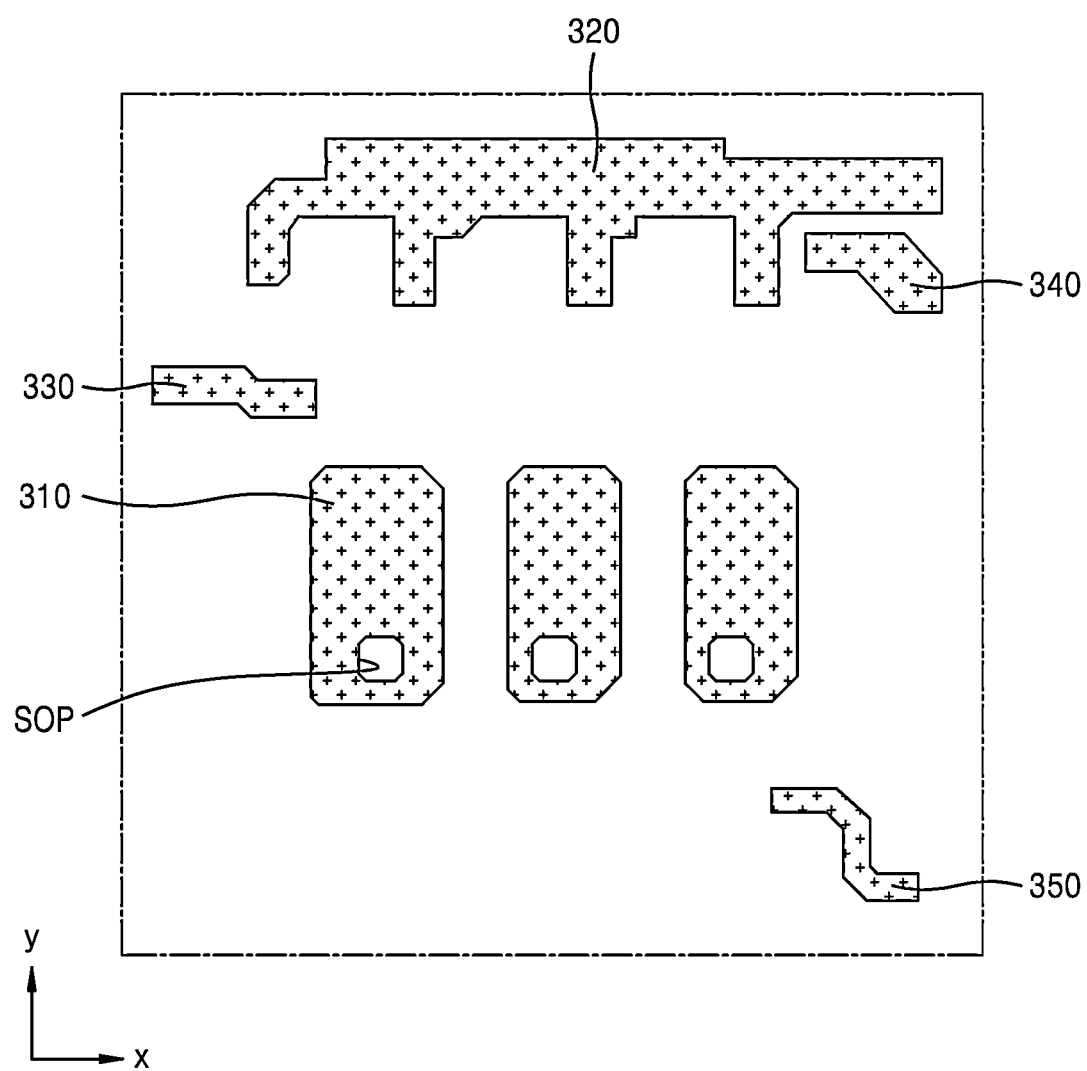
Figure 13:
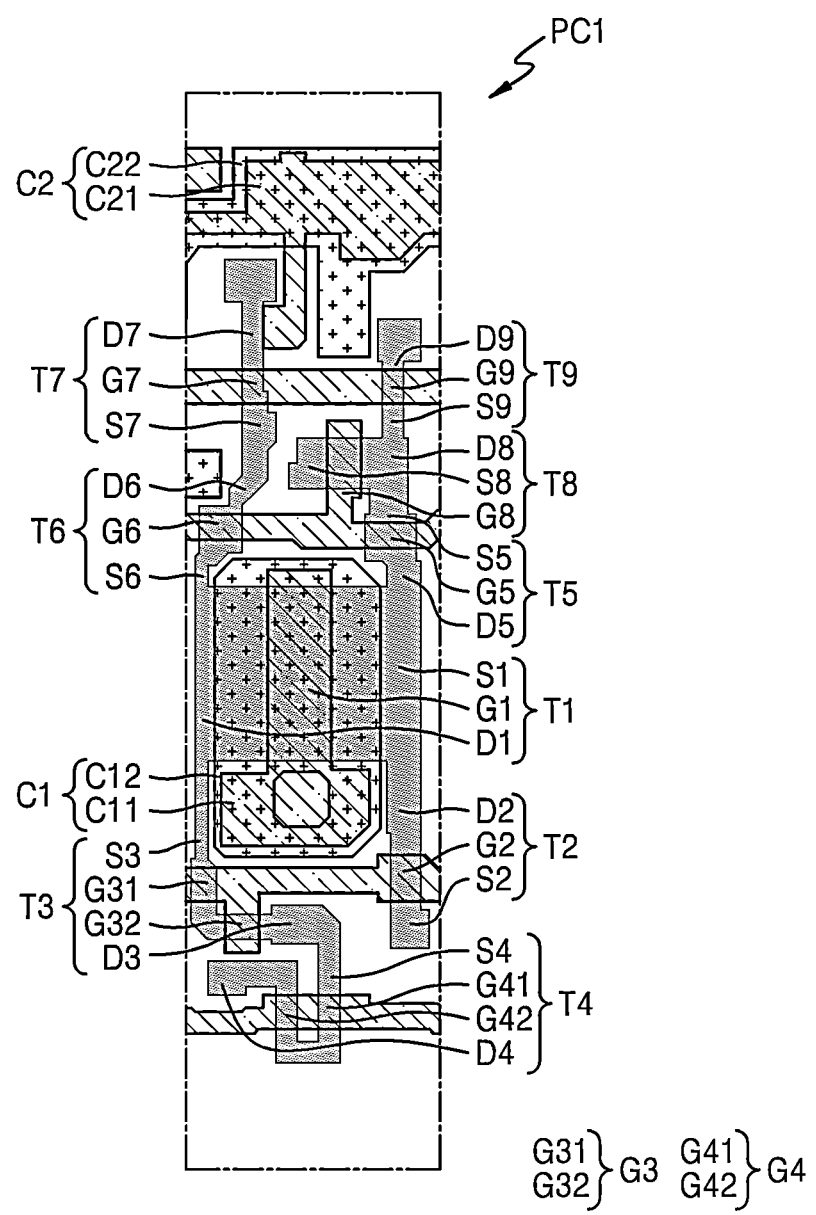

A second insulating layer 112 (see FIG. 19) may be disposed on the first insulating layer 111 and cover the first conductive layer, and as illustrated in FIG. 12, a second conductive layer may be disposed on the second insulating layer 112. The second conductive layer may include a third electrode 310, a fourth electrode 320, and connection electrodes 330, 340, and 350. The third electrode 310, the fourth electrode 320, and the connection electrodes 330, 340, and 350 may be provided as island type electrodes.

The third electrode 310 may cover the first electrode 210 and overlap the first electrode 210. The third electrode 310 may include an opening SOP. The opening SOP may overlap a portion of the first electrode 210.

The fourth electrode 320 may cover a second electrode 220 of each of the first pixel PX1, the second pixel PX2, and the third pixel PX3 and may overlap the second electrode 220 of each of the first pixel PX1, the second pixel PX2, and the third pixel PX3.

Referring to FIG. 13, the first electrode 210 and the third electrode 310 overlapping the first electrode 210 may be a first electrode and a second electrode of the first capacitor C1, respectively. That is, the first electrode of the first capacitor C1 may be a portion of the gate electrode G1 of the first transistor T1. The first capacitor C1 may be arranged to vertically overlap the first transistor T1.

Referring to FIG. 19 together, the second electrode 220 and the fourth electrode 320 overlapping the second electrode 220 may be a first electrode C21 and a second electrode C22 of the second capacitor C2, respectively. Second electrodes C22 of second capacitors C2 of the first pixel PX1, the second pixel PX2, and the third pixel PX3 may be connected to each other. Second electrodes C22 of second capacitors C2 of the first pixel PX1, the second pixel PX2, and the third pixel PX3 may be provided as a single body.

A third insulating layer 113 (see FIG. 19) may be disposed on the second insulating layer 112 and cover the second conductive layer, and contact holes may be formed in the first insulating layer 111, the second insulating layer 112, and the third insulating layer 113. Thereafter, an area other than an area corresponding to the first island portion 11 is removed in the barrier layer 110, the first insulating layer 111, the second insulating layer 112, and the third insulating layer 113, and accordingly, an opening corresponding to an area other than the area corresponding to the first island portion 11 may be defined in the barrier layer 110, the first insulating layer 111, the second insulating layer 112, and the third insulating layer 113. That is, the barrier layer 110, the first insulating layer 111, the second insulating layer 112, and the third insulating layer 113 may not be arranged in the first bridge portions 12 but may be arranged in the first island portion 11. The barrier layer 110, the first insulating layer 111, the second insulating layer 112, and the third insulating layer 113 may each have an island shape corresponding to the first island portion 11.

A fourth insulating layer 114 may be arranged in an area other than the area corresponding to the first island portion 11 of the substrate 100. That is, the fourth insulating layer 114 may not be arranged in the first island portion 11 but may be arranged in the first bridge portion 12.

Figure 14:
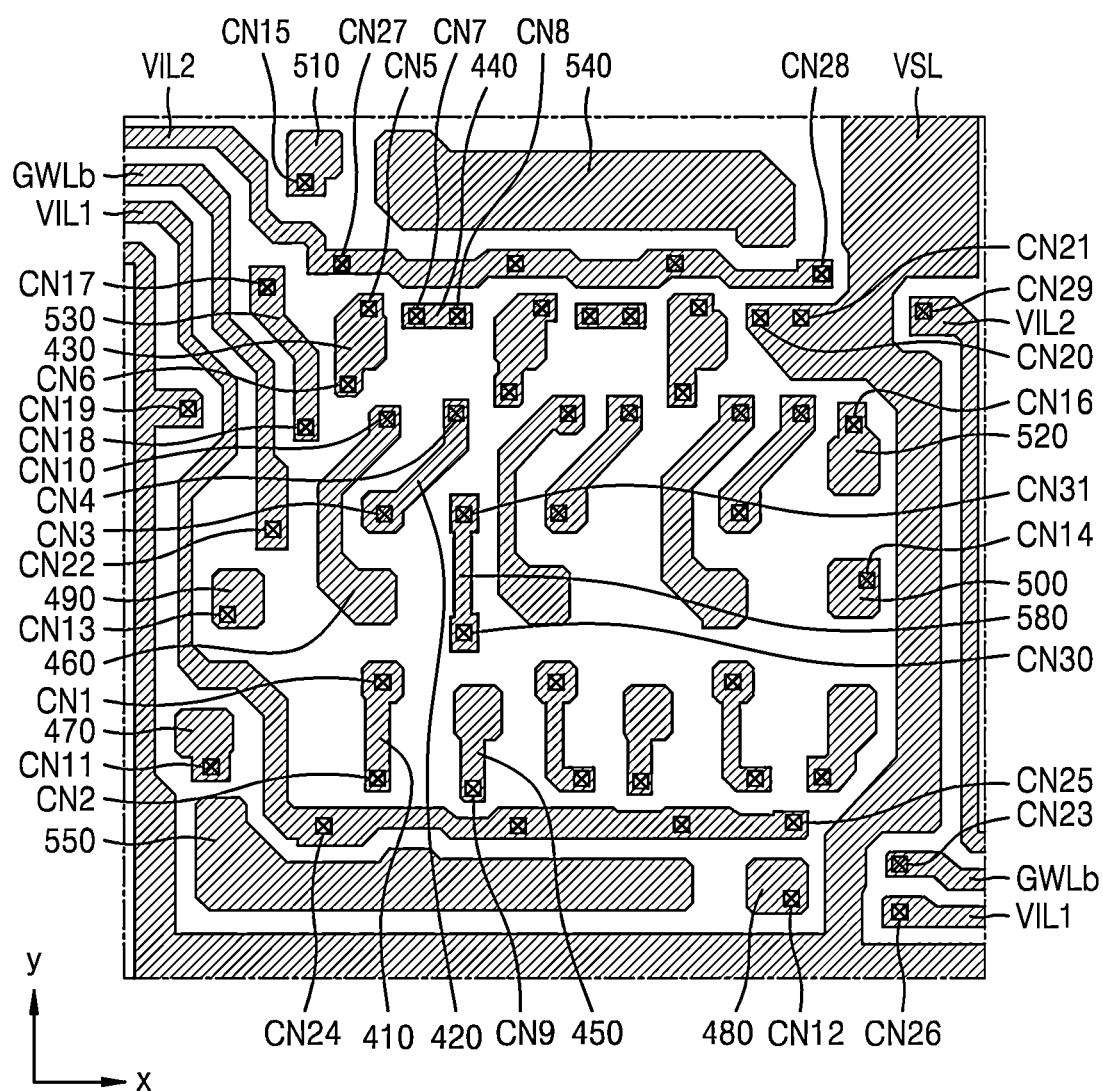
Figure 15:
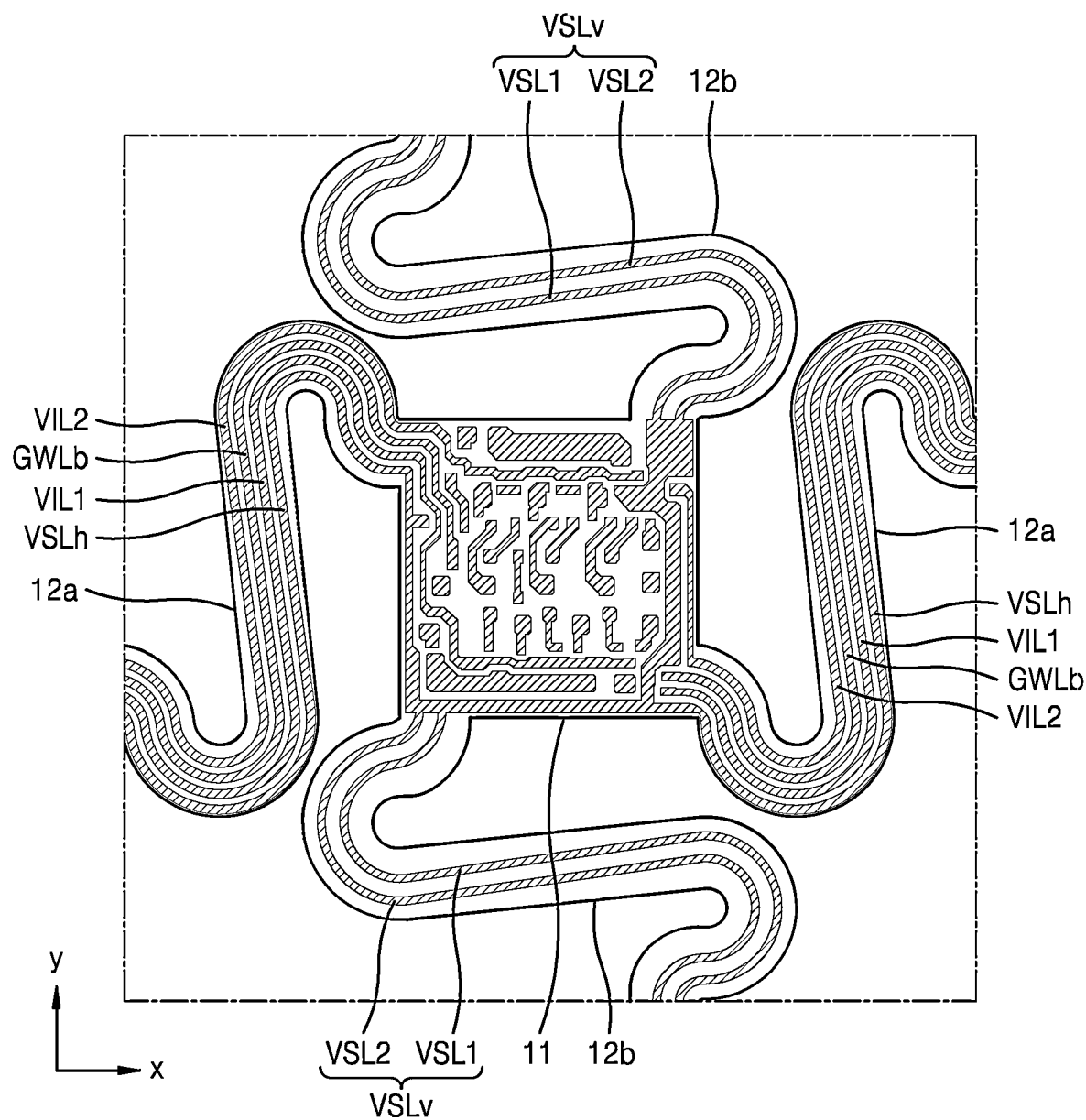

As illustrated in FIGS. 14 and 15, a third conductive layer may be disposed on the third insulating layer 113 of the first island portion 11 and on the fourth insulating layer 114 of first bridge portions 12a and 12b. The third conductive layer may include node electrodes 410 and 420, connection electrodes 430, 440, 450, 460, 470, 480, 490, 500, 510, 520, 530, 540, and 550, a compensation electrode 580, and conductive lines. The conductive lines may include the sustain voltage line VSL, the first initialization voltage line VIL1, the second initialization voltage line VIL2, and a first gate connection line GWLb.

In some aspects, some conductive lines may extend from the first island portion 11 in the first direction and/or the second direction and may be arranged to extend to the horizontal bridge portions 12a and/or the vertical bridge portions 12b. Some conductive lines may be connection lines that are arranged in the horizontal bridge portions 12a and/or the vertical bridge portions 12b and connect conductive lines arranged in adjacent first island portions 11.

The sustain voltage line VSL may be arranged to extend along a portion of an edge of the first island portion 11. The sustain voltage line VSL may include a first sustain voltage line VSLh that is a horizontal voltage line extending in the first direction by extending from two of four corners of the first island portion 11 to the horizontal bridge portions 12a. The sustain voltage line VSL may include a second sustain voltage line VSLv that is a vertical voltage line extending in the second direction by extending from the other two of the four corners of the first island portion 11 to the vertical bridge portions 12b. Accordingly, the sustain voltage line VSL may have a mesh structure in a display area. The second sustain voltage line VSLv arranged in the vertical bridge portions 12b may branch off into two sub-lines, that is, a first sub-line VSL1 and a second sub-line VSL2, at a corner of the first island portion 11. The first sub-line VSL1 and the second sub-line VSL2 may be spaced apart in the vertical bridge portions 12b and extend parallel to each other.

The first initialization voltage line VIL1 and the second initialization voltage line VIL2 may be horizontal voltage lines extending in the first direction. The first initialization voltage line VIL1 and the second initialization voltage line VIL2 may extend in the first island portion 11 in the first direction and may extend from one of the four corners of the first island portion 11 to a horizontal bridge portion 12a. First ends of the first initialization voltage line VIL1 and the second initialization voltage line VIL2 may be located in the first island portion 11, and second ends of the first initialization voltage line VIL1 and the second initialization voltage line VIL2 may be located at one of four corners of an adjacent first island portion 11 through the horizontal bridge portion 12a. For example, as illustrated in FIG. 15, the first initialization voltage line VIL1 and the second initialization voltage line VIL2 may extend from a left corner of the four corners of the first island portion 11 to a left horizontal bridge portion 12a, and the other ends of the first initialization voltage line VIL1 and the second initialization voltage line VIL2 extending from another first island portion 11 (not illustrated) adjacent on the right through a right horizontal bridge portion 12a may be located at a right corner of the four corners of the first island portion 11.

The first gate connection line GWLb may be arranged in the horizontal bridge portions 12a. The first gate connection line GWLb may connect first gate lines GWL arranged in the first island portions 11 that are adjacent in the first direction. For example, as illustrated in FIG. 15, one end of the first gate connection line GWLb arranged in the left horizontal bridge portion 12a may be located at the left corner of the four corners of the first island portion 11, and one end of the first gate connection line GWLb arranged in the right horizontal bridge portion 12a may be located at the right corner of the four corners of the first island portion 11.

In the horizontal bridge portions 12a, the second initialization voltage line VIL2, the first gate connection line GWLb, the first initialization voltage line VIL1, and the sustain voltage line VSL may be spaced apart from each other and may extend parallel to each other.

A node electrode 410 (e.g., illustrated at FIG. 14) may be electrically connected to the first electrode 210 through a contact hole CN1 passing through the second insulating layer 112 and the third insulating layer 113, and the node electrode 410 may be electrically connected to the drain region D3 of the third transistor T3 and the source region S4 of the fourth transistor T4 through a contact hole CN2 passing through the first insulating layer 111, the second insulating layer 112, and the third insulating layer 113. Accordingly, the gate electrode G1 of the first transistor T1 may be electrically connected to the drain region D3 of the third transistor T3 and the source region S4 of the fourth transistor T4.

A node electrode 420 may correspond to the second node N2 illustrated in FIG. 4. The node electrode 420 may be electrically connected to the third electrode 310 through a contact hole CN3 passing through the third insulating layer 113, and may be electrically connected to the source region S5 of the fifth transistor T5, the drain region D8 of the eighth transistor T8, and source region S9 of the ninth transistor T9 through a contact hole CN4 passing through the first insulating layer 111, the second insulating layer 112, and the third insulating layer 113. Accordingly, the second electrode of the first capacitor C1 may be electrically connected to the source region S5 of the fifth transistor T5, the drain region D8 of the eighth transistor T8, and source region S9 of the ninth transistor T9.

A connection electrode 430 may be electrically connected to the second electrode 220 through a contact hole CN5 passing through the second insulating layer 112 and the third insulating layer 113, and the connection electrode 430 may be electrically connected to the drain region D6 of the sixth transistor T6 and the source region S7 of the seventh transistor T7 through a contact hole CN6 passing through the first insulating layer 111, the second insulating layer 112, and the third insulating layer 113. Accordingly, the first electrode C21 of the second capacitor C2 may be electrically connected to the drain region D6 of the sixth transistor T6 and the source region S7 of the seventh transistor T7.

A connection electrode 440 may be electrically connected to the fourth electrode 320 through a contact hole CN7 passing through the third insulating layer 113, and the connection electrodes 440 may be electrically connected to the drain region D9 of the ninth transistor T9 through a contact hole CN8 passing through the first insulating layer 111, the second insulating layer 112, and the third insulating layer 113. Accordingly, the second electrode C22 of the second capacitor C2 may be electrically connected to the drain region D9 of the ninth transistor T9.

A connection electrode 450 may be electrically connected to the source region S2 of the second transistor T2 through a contact hole CN9 passing through the first insulating layer 111, the second insulating layer 112, and the third insulating layer 113.

A connection electrode 460 may be electrically connected to the source region S5 of the fifth transistor T5 through a contact hole CN10 passing through the first insulating layer 111, the second insulating layer 112, and the third insulating layer 113.

A connection electrode 470 may be electrically connected to one end of the second gate line GIL through a contact hole CN11 passing through the second insulating layer 112 and the third insulating layer 113.

A connection electrode 480 may be electrically connected to the other end of the second gate line GIL through a contact hole CN12 passing through the second insulating layer 112 and the third insulating layer 113.

A connection electrode 490 may be electrically connected to one end of the third gate line EML through a contact hole CN13 passing through the second insulating layer 112 and the third insulating layer 113.

A connection electrode 500 may be electrically connected to the other end of the third gate line EML through a contact hole CN14 passing through the second insulating layer 112 and the third insulating layer 113.

A connection electrode 510 may be electrically connected to one end of the fourth gate line GBL through a contact hole CN15 passing through the second insulating layer 112 and the third insulating layer 113.

A connection electrode 520 may be electrically connected to the other end of the fourth gate line GBL through a contact hole CN16 passing through the second insulating layer 112 and the third insulating layer 113.

A connection electrode 530 may be electrically connected to the fourth electrode 320 through a contact hole CN17 passing through the third insulating layer 113 and may be electrically connected to the connection electrode 330 through a contact hole CN18 passing through the third insulating layer 113.

The sustain voltage line VSL may be electrically connected to the connection electrode 330 through a contact hole CN19 passing through the third insulating layer 113. The sustain voltage line VSL may be electrically connected to the fourth electrode 320 through a contact hole CN20 passing through the third insulating layer 113, and the sustain voltage line VSL may be electrically connected to the drain region D9 of the ninth transistor T9 of the third pixel circuit PC3 through a contact hole CN21 passing through the first insulating layer 111, the second insulating layer 112, and the third insulating layer 113. Accordingly, the sustain voltage line VSL may be electrically connected to the second electrode C22 of the second capacitor C2 and the drain region D9 of the ninth transistor T9.

The first gate connection line GWLb arranged in the left horizontal bridge portion 12a and having one end located at the left corner may be electrically connected to one end of the first gate line GWL through a contact hole CN22 passing through the second insulating layer 112 and the third insulating layer 113. The first gate connection line GWLb arranged in the right horizontal bridge portion 12a and having one end located at the right corner may be electrically connected to the other end of the first gate line GWL through a contact hole CN23 passing through the second insulating layer 112 and the third insulating layer 113.

The first initialization voltage line VIL1 may be electrically connected to the drain region D4 of the fourth transistor T4 through a contact hole CN24 passing through the first insulating layer 111, the second insulating layer 112, and the third insulating layer 113. One end of the first initialization voltage line VIL1 may be electrically connected to the connection electrode 350 through a contact hole CN25 passing through the third insulating layer 113. The connection electrode 350 may be electrically connected to the other end of the first initialization voltage line VIL1 extending along the right horizontal bridge portion 12a from the first island portion 11 adjacent on the right through a contact hole CN26 passing through the third insulating layer 113.

The second initialization voltage line VIL2 may be electrically connected to the drain region D7 of the seventh transistor T7 through a contact hole CN27 passing through the first insulating layer 111, the second insulating layer 112, and the third insulating layer 113. One end of the second initialization voltage line VIL2 may be electrically connected to the connection electrode 340 through a contact hole CN28 passing through the third insulating layer 113. The connection electrode 340 may be electrically connected to the other end of the second initialization voltage line VIL2 extending along the right horizontal bridge portion 12a from the first island portion 11 adjacent on the right through a contact hole CN29 passing through the third insulating layer 113.

A connection electrode 540 may be arranged to overlap the fourth electrode 320. A connection electrode 550 may be arranged to overlap a semiconductor layer between the two channel regions of the fourth transistor T4.

The compensation electrode 580 may overlap a portion of the source region S1 of the first transistor T1 and may not overlap the third electrode 310. The compensation electrode 580 may be electrically connected to the drain region D2 of the second transistor T2 through a contact hole CN30 passing through the first insulating layer 111, the second insulating layer 112, and the third insulating layer 113. The compensation electrode 580 may be electrically connected to the drain region D5 of the fifth transistor T5 through a contact hole CN31 passing through the first insulating layer 111, the second insulating layer 112, and the third insulating layer 113. Resistance components in the source region S1 of the first transistor T1 may be minimized by the compensation electrode 580. In the example illustrated at FIG. 14, the compensation electrode 580 is arranged in the first pixel circuit PC1, but the compensation electrode 580 may be arranged in the first pixel circuit PC1, the second pixel circuit PC2, and the third pixel circuit PC3, considering the efficiency of the light-emitting elements LED connected to the pixel circuits.

Figure 16:
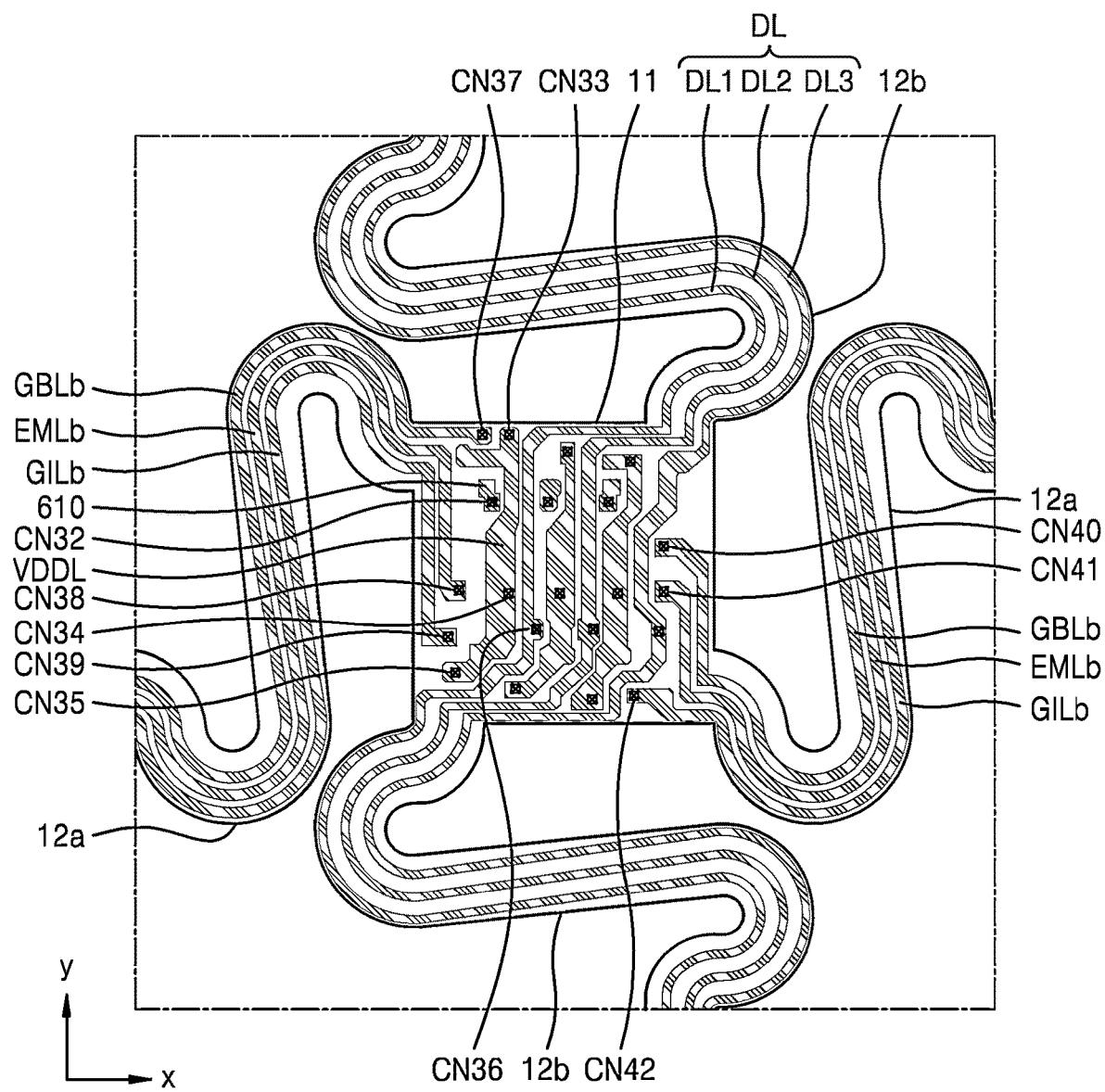

A fifth insulating layer 115 may be disposed on the substrate 100 and cover the third insulating layer 113 and the fourth insulating layer 114, and as illustrated in FIG. 16, a fourth conductive layer may be disposed on the fifth insulating layer 115. The fourth conductive layer may include a connection electrode 610, the first driving voltage line VDDL, a second gate connection line GILb, a third gate connection line EMLb, a fourth gate connection line GBLb, and the data lines DL.

The connection electrode 610 and the first driving voltage line VDDL may be arranged in the first island portion 11. The connection electrode 610 may be electrically connected to the connection electrode 430 through a contact hole CN32 passing through the fifth insulating layer 115. The first driving voltage line VDDL may be electrically connected to the connection electrode 540 through a contact hole CN33 passing through the fifth insulating layer 115, may be electrically connected to the connection electrode 460 through a contact hole CN34 passing through the fifth insulating layer 115, and may be electrically connected to the connection electrode 550 through a contact hole CN35 passing through the fifth insulating layer 115.

The second gate connection line GILb, the third gate connection line EMLb, and the fourth gate connection line GBLb may be arranged in the horizontal bridge portions 12*a* and connect the second gate line GIL, the third gate line EML, and the fourth gate line GBL arranged in the first island portions 11 that are adjacent in the first direction.

The second gate connection line GILb may connect second gate lines GIL arranged in the first island portions 11 that are adjacent in the first direction. For example, as illustrated in FIG. 16, one end of the second gate connection line GILb arranged in the left horizontal bridge portion 12*a* may be located at the left corner of the four corners of the first island portion 11, and one end of the second gate connection line GILb arranged in the right horizontal bridge portion 12*a* may be located at the right corner of the four corners of the first island portion 11.

The third gate connection line EMLb may connect third gate lines EML arranged in the first island portions 11 that are adjacent in the first direction. For example, as illustrated in FIG. 16, one end of the third gate connection line EMLb arranged in the left horizontal bridge portion 12*a* may be located at the left corner of the four corners of the first island portion 11, and one end of the third gate connection line EMLb arranged in the right horizontal bridge portion 12*a* may be located at the right corner of the four corners of the first island portion 11.

The fourth gate connection line GBLb may connect fourth gate lines GBL arranged in the first island portions 11 that are adjacent in the first direction. For example, as illustrated in FIG. 16, one end of the fourth gate connection line GBLb arranged in the left horizontal bridge portion 12*a* may be located at the left corner of the four corners of the first island portion 11, and one end of the fourth gate connection line GBLb arranged in the right horizontal bridge portion 12*a* may be located at the right corner of the four corners of the first island portion 11.

In the horizontal bridge portions 12*a*, the second gate connection line GILb, the third gate connection line EMLb, and the fourth gate connection line GBLb may be spaced apart from each other and may extend parallel to each other.

The second gate connection line GILb arranged in the left horizontal bridge portion 12*a* and having one end located at the left corner may be electrically connected to the connection electrode 470 through a contact hole CN39 passing through the fifth insulating layer 115 and may thus be electrically connected to one end of the second gate line GIL. The second gate connection line GILb arranged in the right horizontal bridge portion 12*a* and having one end located at the right corner may be electrically connected to the connection electrode 480 through a contact hole CN42 passing through the fifth insulating layer 115 and may thus be electrically connected to the other end of the second gate line GIL.

The third gate connection line EMLb arranged in the left horizontal bridge portion 12*a* and having one end located at the left corner may be electrically connected to the connection electrode 490 through a contact hole CN38 passing through the fifth insulating layer 115 and may thus be electrically connected to one end of the third gate line EML. The third gate connection line EMLb arranged in the right horizontal bridge portion 12*a* and having one end located at the right corner may be electrically connected to the connection electrode 500 through a contact hole CN41 passing through the fifth insulating layer 115 and may thus be electrically connected to the other end of the third gate line EML.

The fourth gate connection line GBLb arranged in the left horizontal bridge portion 12*a* and having one end located at the left corner may be electrically connected to the connection electrode 510 through a contact hole CN37 passing through the fifth insulating layer 115 and may thus be electrically connected to one end of the fourth gate line GBL. The fourth gate connection line GBLb arranged in the right horizontal bridge portion 12*a* and having one end located at the right corner may be electrically connected to the connection electrode 520 through a contact hole CN40 passing through the fifth insulating layer 115 and may thus be electrically connected to the other end of the fourth gate line GBL.

The data lines DL may be disposed in the vertical bridge portions 12*b* that connect the first island portion 11 to the first island portions 11 adjacent thereto in the second direction. The data lines DL may include a first data line DL1 connected to the first pixel circuit PC1, a second data line DL2 connected to the second pixel circuit PC2, and a third data line DL3 connected to the third pixel circuit PC3. The first data line DL1, the second data line DL2, and the third data line DL3 of the first island portion 11 may extend to the vertical bridge portions 12*b* and be connected to pixels of the first island portions 11 that are adjacent in the second direction.

Each of the first data line DL1, the second data line DL2, and the third data line DL3 may be electrically connected to the connection electrode 450 through a contact hole CN36 passing through the fifth insulating layer 115 and may thus be electrically connected to the source region S2 of the second transistor T2.

Figure 17:
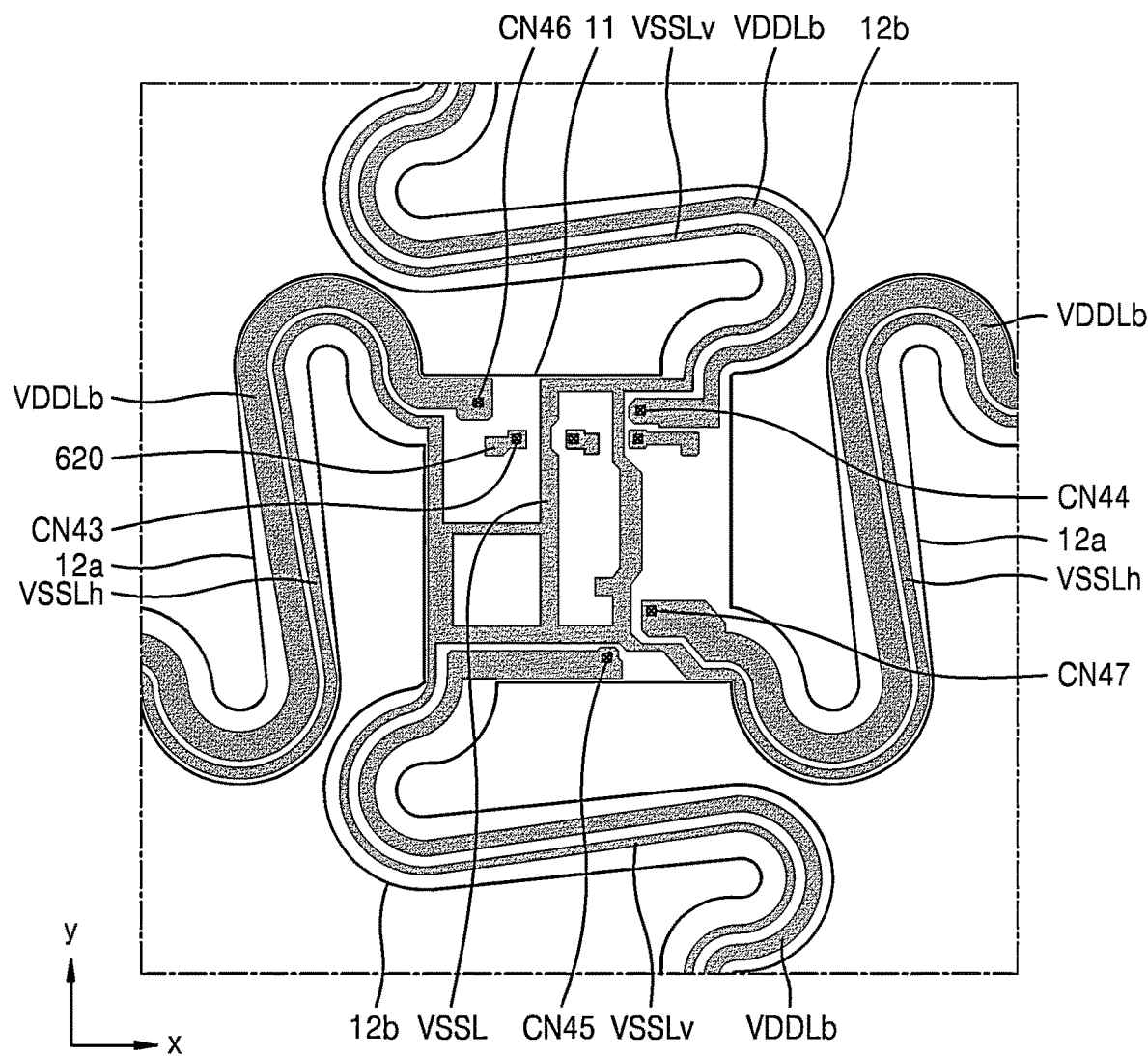

A sixth insulating layer 116 may be disposed on the substrate 100 and cover the fifth insulating layer 115, and as illustrated in FIG. 17, a fifth conductive layer may be disposed on the sixth insulating layer 116. The fifth conductive layer may include a connection electrode 620, a first driving voltage connection line VDDLb, and the second driving voltage line VSSL. In an embodiment, a width of the first driving voltage connection line VDDLb may be greater than a width of the second driving voltage line VSSL.

The connection electrode 620 may be arranged in the first island portion 11. The connection electrode 620 may be electrically connected to the connection electrode 610 through a contact hole CN43 passing through the sixth insulating layer 116.

The first driving voltage connection line VDDLb may connect first driving voltage lines VDDL arranged in the first island portions 11 that are adjacent in the first direction and the second direction. Hereinafter, the first driving voltage connection line VDDLb arranged in the horizontal bridge portions 12*a* may be referred to as a horizontal voltage connection line, and the first driving voltage connection line VDDLb arranged in the vertical bridge portions 12*b* may be referred to as a vertical voltage connection line.

One end of the first driving voltage connection line VDDLb arranged in the left horizontal bridge portion 12*a* may be located at the left corner of the first island portion 11, one end of the first driving voltage connection line VDDLb arranged in the right horizontal bridge portion 12*a* may be located at the right corner of the first island portion 11, one end of the first driving voltage connection line VDDLb arranged in an upper vertical bridge portion 12*b* may be located at an upper corner of the first island portion 11, and one end of the first driving voltage connection line VDDLb arranged in a lower vertical bridge portion 12b may be located at a lower corner of the first island portion 11.

One end of the first driving voltage connection line VDDLb arranged in the left horizontal bridge portion 12a may be electrically connected to the first driving voltage line VDDL connected to the first pixel circuit PC1, through a contact hole CN46 passing through the sixth insulating layer 116. One end of the first driving voltage connection line VDDLb arranged in the right horizontal bridge portion 12a may be electrically connected to the first driving voltage line VDDL through a contact hole CN47 passing through the sixth insulating layer 116, the first driving voltage line VDDL being connected to the third pixel circuit PC3. One end of the first driving voltage connection line VDDLb arranged in the upper vertical bridge portion 12b may be electrically connected to the first driving voltage line VDDL through a contact hole CN44 passing through the sixth insulating layer 116, the first driving voltage line VDDL being connected to the third pixel circuit PC3. One end of the first driving voltage connection line VDDLb arranged in the lower vertical bridge portion 12b may be electrically connected to the connection electrode 550 through a contact hole CN45 passing through the fifth insulating layer 115 and the sixth insulating layer 116.

First driving voltage connection lines VDDLb arranged in the first bridge portions 12 are electrically connected to the first driving voltage lines VDDL of the first island portion 11, and accordingly, the first driving voltage line VDDL may have a mesh structure in the display area.

The second driving voltage line VSSL may include a second horizontal driving voltage line VSSLh that is arranged in the first island portion 11 and extends in the first direction by extending from two of the four corners of the first island portion 11 to the horizontal bridge portions 12a in the first direction, and a second vertical driving voltage line VSSLv extending in the second direction by extending from the other two of the four corners of the first island portion 11 to the vertical bridge portions 12b in the second direction. Accordingly, the second driving voltage line VSSL may have a mesh structure in the display area. In the first island portion 11, the second driving voltage line VSSL may include a sub-line extending in the second direction along a boundary between an area where the first pixel circuit PC1 is arranged and an area where the second pixel circuit PC2 is arranged, a sub-line extending in the second direction along a boundary between the area where the second pixel circuit PC2 is arranged and an area where the third pixel circuit PC3 is arranged, and a sub-line extending in the first direction and the second direction along a portion of the edge of the first island portion 11.

FIG. 18 is a diagram illustrating an example in which the third conductive layer of FIG. 15, the fourth conductive layer of FIG. 16, and the fifth conductive layer of FIG. 17 are stacked together. Referring to FIG. 20, the first data line DL1, the second data line DL2, and the third data line DL3 may not overlap sub-lines VSL1 and VSL2 of the sustain voltage line VSL arranged under the first data line DL1, the second data line DL2, and the third data line DL3. The first driving voltage connection line VDDLb and the second driving voltage line VSSL may not overlap the first data line DL1, the second data line DL2, and the third data line DL3 arranged under the first driving voltage line VDDLb and the second driving voltage line VSSL. The first driving voltage connection line VDDLb and the second driving voltage line VSSL may overlap the sub-lines VSL1 and VSL2 of the sustain voltage line VSL.

A parasitic capacitor may be formed between each of the first data line DL1, the second data line DL2, and the third data line DL3 and upper and lower conductive lines, and capacitance of the capacitor may vary depending on a degree to which each of the first data line DL1, the second data line DL2, and the third data line DL3 overlaps with the upper and lower conductive lines. In this case, a load may occur on each of the first data line DL1, the second data line DL2, and the third data line DL3, and a luminance deviation between pixels may occur.

In an embodiment, each of the first data line DL1, the second data line DL2, and the third data line DL3 may not overlap upper conductive lines and lower conductive lines. Accordingly, the load occurring on each of the first data line DL1, the second data line DL2, and the third data line DL3 may be minimized, enabling high-frequency driving and minimizing the luminance deviation between the pixels.

Figure 21:
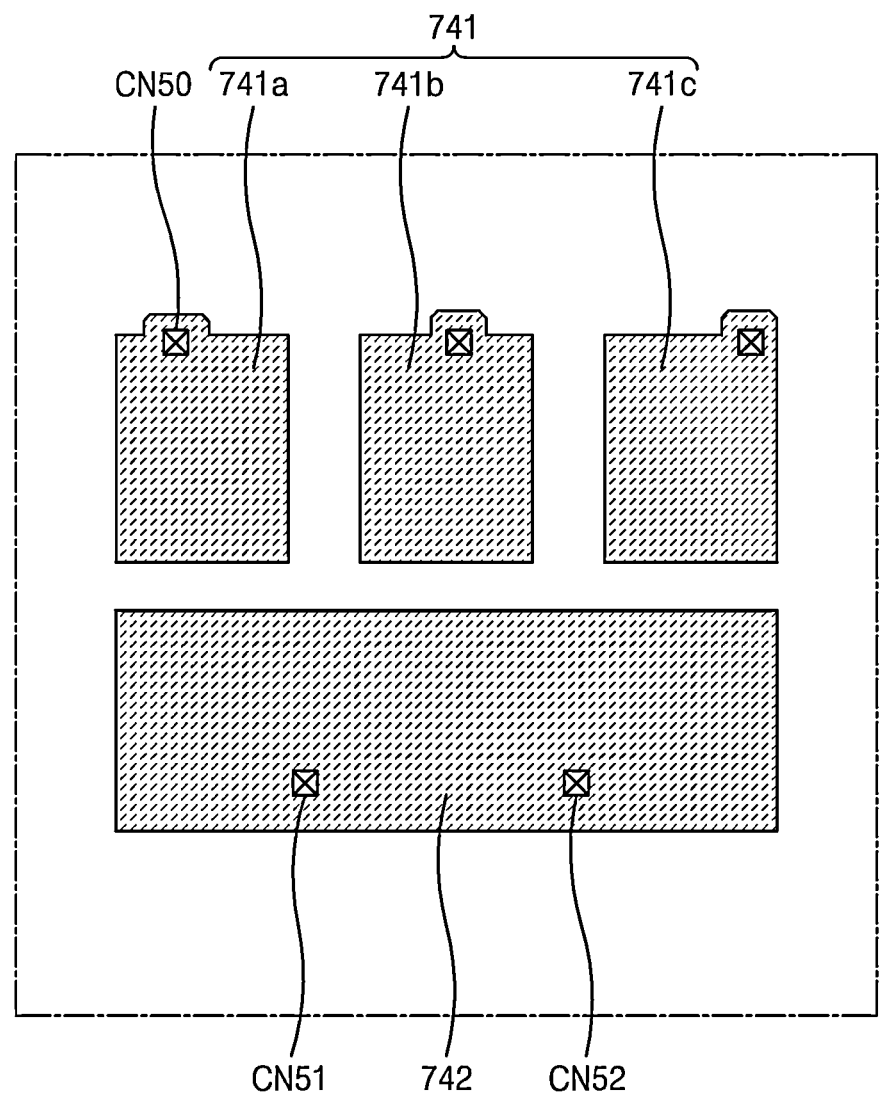
FIG. 21 is a diagram of electrode pads electrically connected to a light-emitting element, according to an embodiment.
Figure 22:
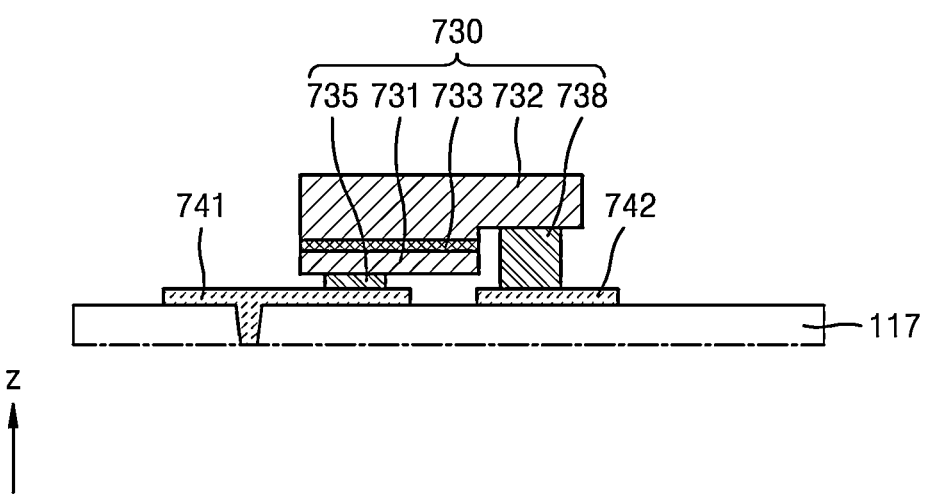
FIGS. 22 and 23 are schematic cross-sectional views of a light-emitting element according to an embodiment.
Figure 23:
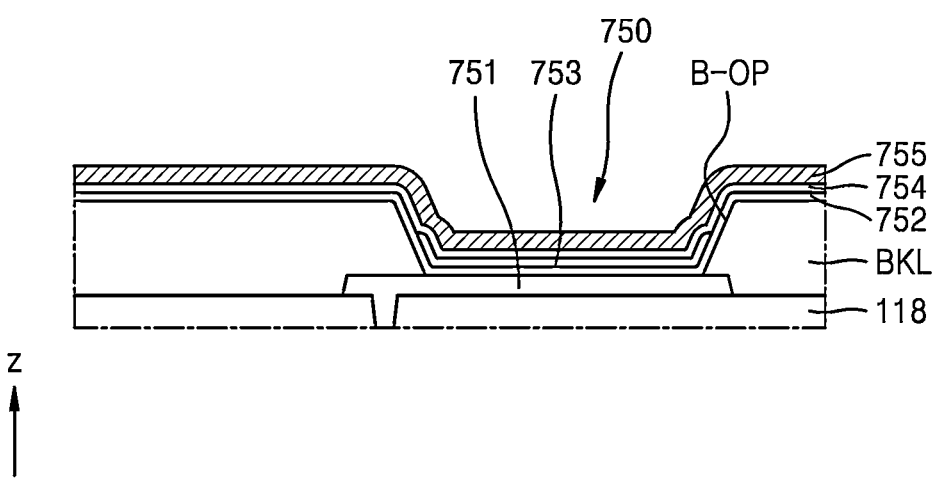

FIG. 21 is a diagram of electrode pads electrically connected to a light-emitting element LED, according to an embodiment. FIGS. 22 and 23 are schematic cross-sectional views of a light-emitting element according to an embodiment.

Referring to FIG. 21, a seventh insulating layer 117 may be disposed on the substrate 100 and cover the sixth insulating layer 116, and a sixth conductive layer may be disposed on the seventh insulating layer 117 of the first island portion 11. The sixth conductive layer may include a first electrode pad 741 and a second electrode pad 742.

The first electrode pad 741 may include a first electrode pad 741a of the first pixel PX1, a first electrode pad 741b of the second pixel PX2, and a first electrode pad 741c of the third pixel PX3. Each of the first electrode pads 741a, 741b, and 741c may be electrically connected to the connection electrode 620 through a contact hole CN50 passing through the seventh insulating layer 117. Accordingly, each of the first electrode pads 741a, 741b, and 741c may be electrically connected to the first electrodes C21 and 220 of the second capacitor C2, the drain region D6 of the sixth transistor T6, and the source region S7 of the seventh transistor T7 through the connection electrode 620, the connection electrode 610, and the connection electrode 430.

The second electrode pad 742 may be provided as a single electrode that is common in the first pixel PX1, the second pixel PX2, and the third pixel PX3. The second electrode pad 742 may be electrically connected to the second driving voltage line VSSL through contact holes CN51 and CN52 passing through the seventh insulating layer 117.

Referring to FIG. 22, in an embodiment, the light-emitting element may include an inorganic light-emitting diode 730 including an inorganic material. The inorganic light-emitting diode 730 may include a first semiconductor layer 731, a second semiconductor layer 732, an intermediate layer 733 between the first semiconductor layer 731 and the second semiconductor layer 732, a first electrode 735 electrically connected to the first semiconductor layer 731, and a second electrode 738 electrically connected to the second semiconductor layer 732. The first electrode 735 and the second electrode 738 of the inorganic light-emitting diode 730 may be electrically connected to the first electrode pad 741 and the second electrode pad 742 arranged on the same layer, respectively.

In some embodiments, the first semiconductor layer 731 may include a p-type semiconductor layer. The p-type semiconductor layer may be selected from among semiconductor materials with a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, or the like and may be doped with a p-type dopant such as, for example, magnesium (Mg), zinc (Zn), calcium (Ca), strontium (Sr), or barium (Ba).

The second semiconductor layer 732 may include, for example, an n-type semiconductor layer. The n-type semiconductor layer may be selected from among semiconductor materials with a composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, AlInN, or the like and may be doped with a p-type dopant such as, for example, silicon (Si), germanium (Ge), or tin (Sn).

The intermediate layer 733 may be a layer where (or include an area where) electrons and holes recombine, and as the electrons and holes recombine, the intermediate layer 733 may transition to a lower energy level and generate light having a corresponding wavelength. The intermediate layer 733 may include a semiconductor material with a composition formula of $In_xAl_yGa_{1-x-y}N$ ($0 \leq x \leq 1$, $0 \leq y \leq 1$, $0 \leq x+y \leq 1$) and may be formed as a single quantum well structure or a multi-quantum well (MQW) structure. The intermediate layer 733 may include a quantum wire structure or a quantum dot structure.

In another embodiment, as illustrated in FIG. 23, the light-emitting element according to an embodiment may include an organic light-emitting diode 750 including an organic material. The organic light-emitting diode 750 may include a first electrode 751 disposed on an insulating layer 118, a second electrode 755 facing the first electrode 751, and an emission layer 753 between the first electrode 751 and the second electrode 755. A first functional layer 752 may be between the first electrode 751 and the emission layer 753, and a second functional layer 754 may be between the emission layer 753 and the second electrode 755.

An edge of the first electrode 751 may be covered with a bank layer BKL including an insulating material. The bank layer BKL may include an opening B-OP overlapping a central portion of the first electrode 751.

The first electrode 751 may include a conductive oxide such as, for example, indium tin oxide (ITO), indium zinc oxide (IZO), zinc oxide (ZnO), indium oxide ($In_2O_3$), indium gallium oxide (IGO), or aluminum zinc oxide (AZO). In another embodiment, the first electrode 751 may include a reflective layer including silver (Ag), Mg, aluminum (Al), platinum (Pt), palladium (Pd), gold (Au), nickel (Ni), neodymium (Nd), iridium (Ir), chromium (Cr), or any compound of silver (Ag), Mg, aluminum (Al), platinum (Pt), palladium (Pd), gold (Au), nickel (Ni), neodymium (Nd), iridium (Ir), or chromium (Cr). In another embodiment, the first electrode 751 may further include a layer including ITO, IZO, ZnO, AZO, or $In_2O_3$ over/under the aforementioned reflective layer.

The emission layer 753 may include a polymer or low molecular weight organic material that emits light of a certain color. The first functional layer 752 may include a hole transport layer (HTL) and/or a hole injection layer (HIL). The second functional layer 754 may include an electron transport layer (ETL) and/or an electron injection layer (EIL).

The second electrode 755 may include a conductive material having a low work function. For example, the second electrode 755 may include a (semi-) transparent layer including Ag, Mg, Al, Pt, Pd, Au, Ni, Nd, Ir, Cr, lithium (Li), Ca, or any alloy of Ag, Mg, Al, Pt, Pd, Au, Ni, Nd, Ir, Cr, lithium (Li), Ca. Alternatively, the second electrode 755 may further include a layer such as, for example, ITO, IZO, ZnO, AZO, or $In_2O_3$ over the (semi-) transparent layer including the aforementioned material.

In an embodiment, the insulating layer 118 may be disposed on the seventh insulating layer 117, and the first electrode 751 and the second electrode 755 of the organic light-emitting diode 750 disposed on the insulating layer 118 may be electrically connected to the first electrode pad 741 and the second electrode pad 742 disposed on the seventh insulating layer 117 through a hole in the insulating layer 118 or holes in the insulating layer 118, the first functional layer 752/second functional layer 754, and the bank layer BKL, respectively.

In another embodiment, the first electrode pad 741 disposed on the seventh insulating layer 117 may function as the first electrode 751 of the organic light-emitting diode 750, and the second electrode 755 of the organic light-emitting diode 750 may be electrically connected to the second electrode pad 742 through holes in the first functional layer 752/second functional layer 754 and the bank layer BKL.

The display apparatus 1 according to the aforementioned embodiments may be used in various types of electronic apparatuses capable of providing images. In this regard, the electronic apparatuses refer to apparatuses that use electricity and may provide certain images.

FIGS. 24A to 24G are respectively schematic perspective views illustrating embodiments of an electronic apparatus including a stretchable display apparatus, according to an embodiment.

Figure 24A:
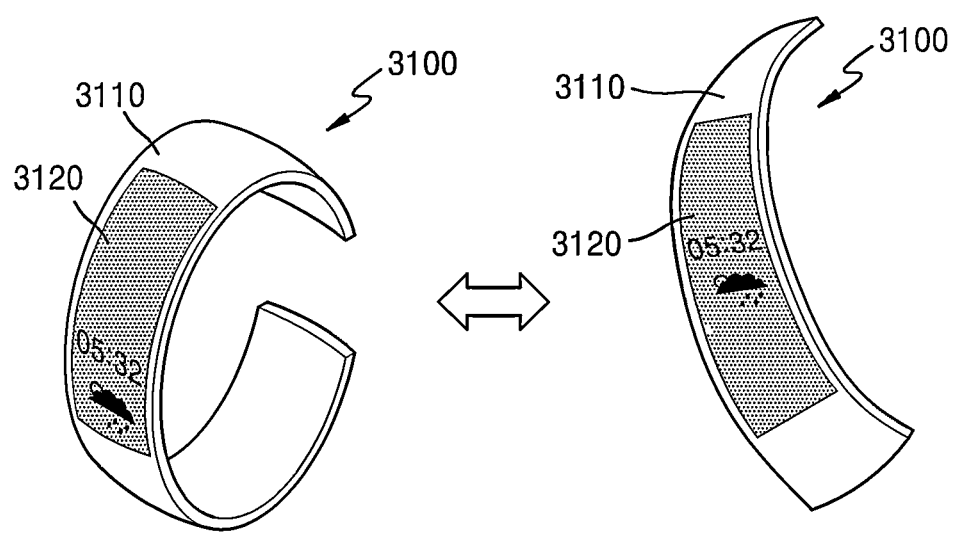
FIGS. 24A to 24G are respectively schematic perspective views illustrating embodiments of an electronic apparatus including a stretchable display apparatus, according to an embodiment.

Referring to FIG. 24A, the display apparatus according to an embodiment may be used in a wearable electronic apparatus 3100 that may be worn on a part of the body of a user. The wearable electronic apparatus 3100 may include a body 3110 and a display 3120 provided in the body 3110. The stretchable display apparatus according to one or more embodiments may be used as the display 3120 of the wearable electronic apparatus 3100. As illustrated in FIG. 24A, the wearable electronic apparatus 3100 may be transformable. In an embodiment, the wearable electronic apparatus 3100 may be used as a smart watch or smartphone according to selection of the user.

Figure 24B:
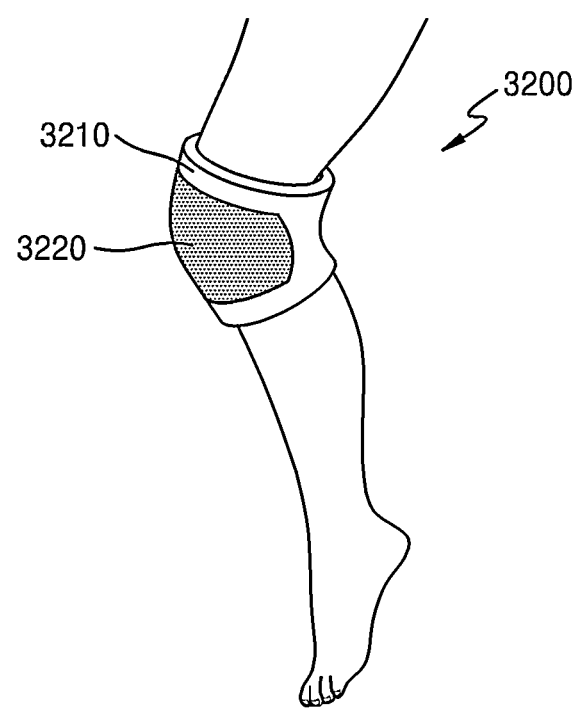

FIG. 24B illustrates a medical electronic apparatus 3200. In an embodiment, the medical electronic apparatus 3200 may include a body 3210 and a light-emitting portion 3220. The stretchable display apparatus according to one or more embodiments may be used as the light-emitting portion 3220 of the medical electronic apparatus 3200. The light-emitting portion 3220 may emit light in a certain wavelength band (e.g., infrared light, visible light, or the like) to the body of a patient. In an embodiment, the body 3210 may include a stretchable fiber material, and the light-emitting portion 3220 may have a structure that may be worn on the body of a user.

Figure 24C:
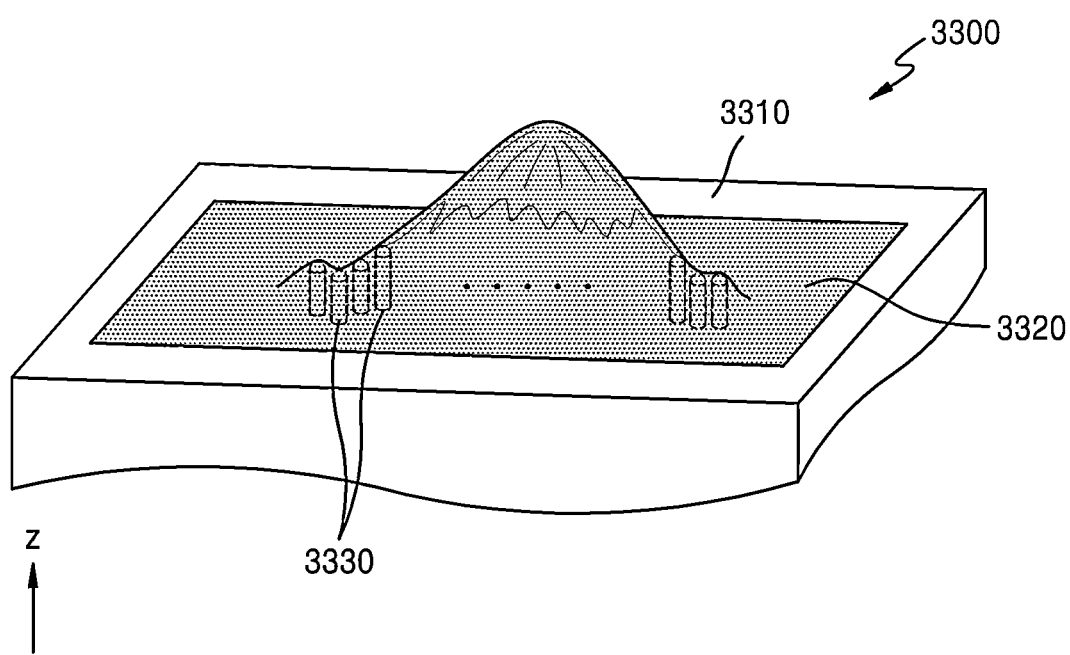

FIG. 24C illustrates an educational electronic apparatus 3300. In an embodiment, the educational electronic apparatus 3300 may include a display 3320 provided in a frame 3310. The display 3320 may use the stretchable display apparatus according to one or more embodiments. The display 3320 may provide images such as, for example, a sea with waves, a mountain covered in snow, or a volcano with flowing lava, and in this case, the display 3320 may extend in a height direction (e.g., a z-direction) to reflect the height of the waves, mountain, or volcano. In some embodiments, a portion of the display 3320 may show the movement of lava in three dimensions by sequentially changing the height in a direction in which the lava flows. The educational electronic apparatus 3300 may include a plurality of pins (or stroke portions) 3330 arranged on the rear surface of the display 3320 such that the display 3320 is stretched in the height direction. As the pins 3330 move in a third direction (e.g., a z-direction or −z direction), images displayed on the display 3320 may be implemented to have a three-dimensional height. FIG. 24C illustrates the educational electronic apparatus 3300, but the use of the educational electronic apparatus 3300 is not limited as long as certain image information are provided.

The electronic apparatuses as illustrated in FIGS. 24A to 24C are described as electronic apparatuses having shapes which may be varied, but one or more embodiments are not limited thereto. As in embodiments to be described below, the stretchable display apparatus according to one or more embodiments may be used in an electronic apparatus in which an area (e.g., a screen) where images may be expressed is fixed.

Figure 24D:
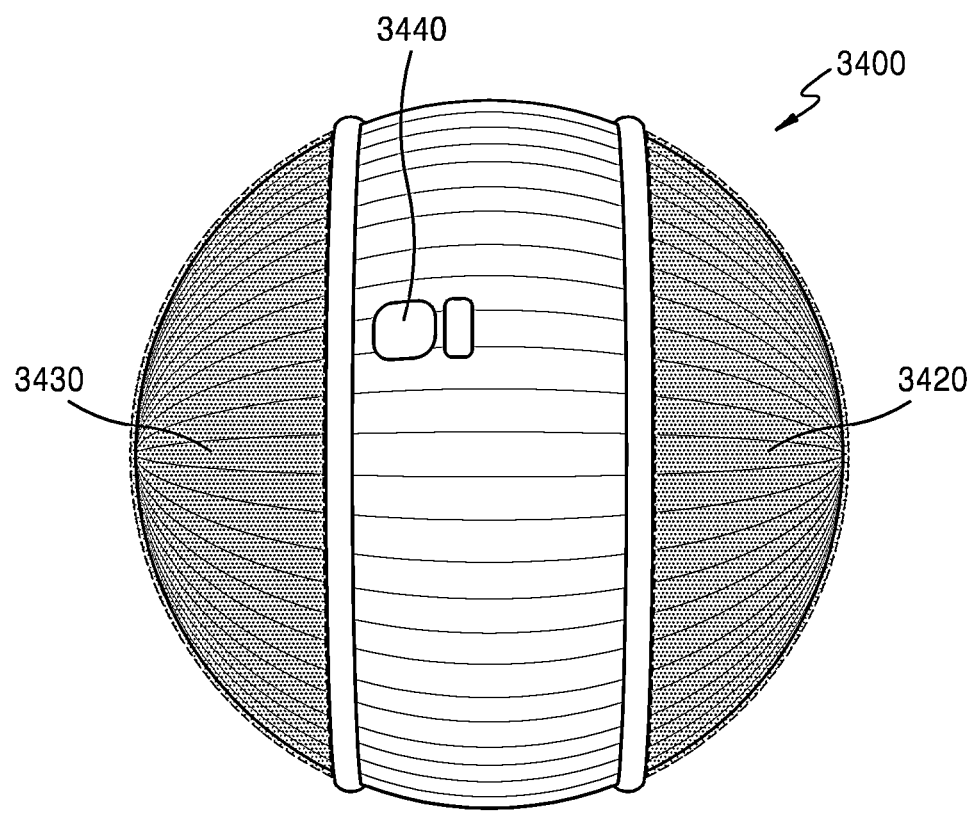

FIG. 24D illustrates a robot 3400 as an electronic apparatus according to an embodiment. The robot 3400 may recognize movement or objects by using a camera 3440 and may display certain images to a user through displays 3420 and 3430. In some embodiments, the stretchable display apparatuses according to one or more embodiments may be stretched in various directions as described above, and thus may be assembled into a body frame having a hemispherical shape, and accordingly, the robot 3400 may include hemispherical displays 3420 and 3430.

Figure 24E:
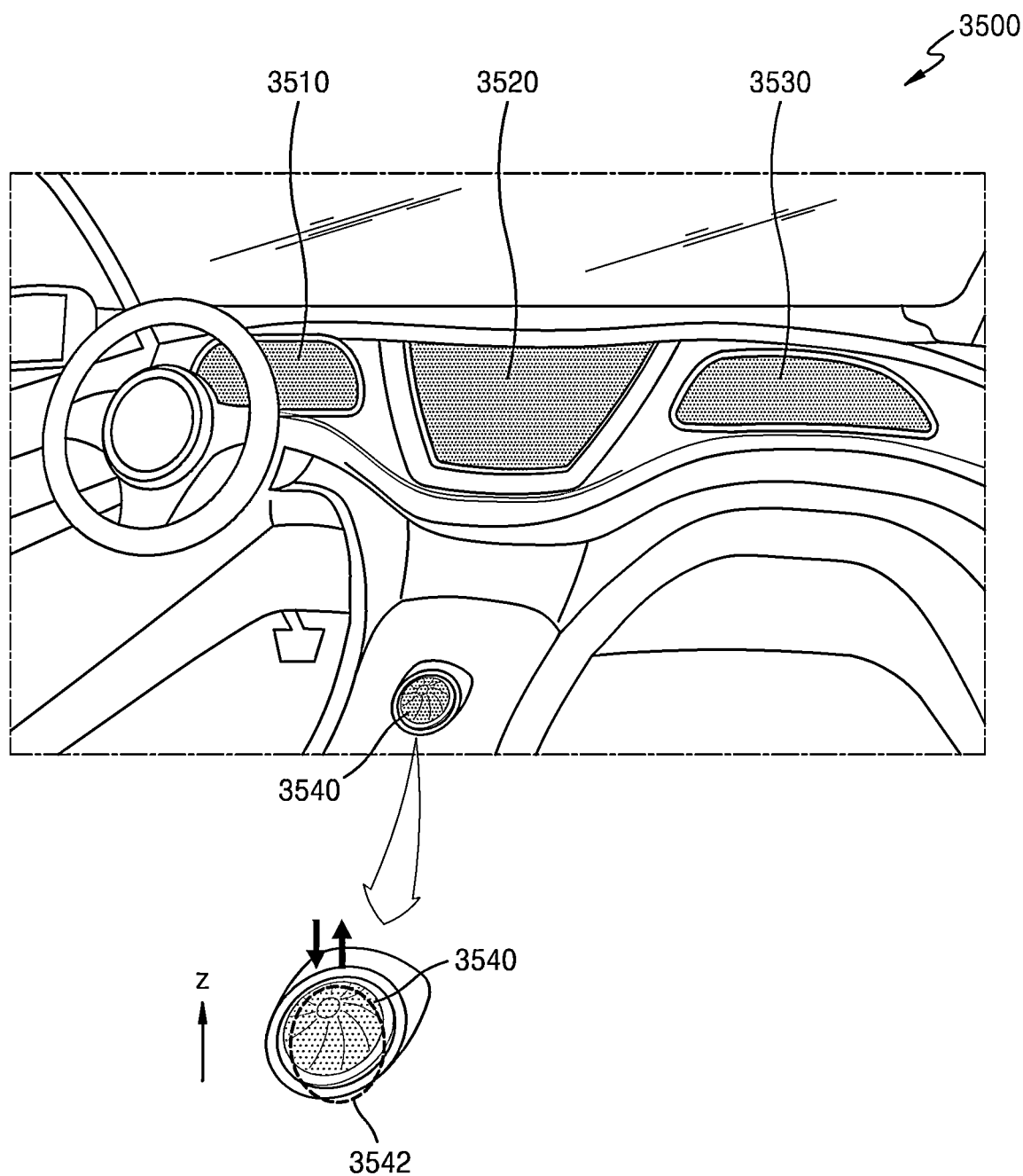

FIG. 24E illustrates a vehicle display apparatus 3500 as an electronic apparatus according to an embodiment. The vehicle display apparatus 3500 may include a cluster 3510 (e.g., a display cluster or information cluster), a center information display (CID) 3520, and/or a passenger display (or co-driver display). The stretchable display apparatus according to one or more embodiments may be stretched in various directions, and thus may be used in the cluster 3510, the CID 3520, and/or the co-driver display regardless of the shape of an internal frame of a vehicle.

FIG. 24E illustrates that the cluster 3510, the CID 3520, and/or the co-driver display are separated from each other, but one or more embodiments are not limited thereto. In another embodiment, two or more selected from among the cluster 3510, the CID 3520, and the co-driver display may be integrally connected.

In some embodiments, the vehicle display apparatus 3500 may include a button 3540 that may express certain images. Referring to an enlarged diagram of FIG. 24E, the button 3540 having a hemispherical shape may include an object 3542 that provides the feeling of using a button while moving in the z-direction or −z direction and a stretchable display apparatus arranged over the object 3542. In some embodiments, when the object 3542 has a three-dimensional round surface, the stretchable display apparatus may also have a three-dimensional round surface.

Figure 24F:
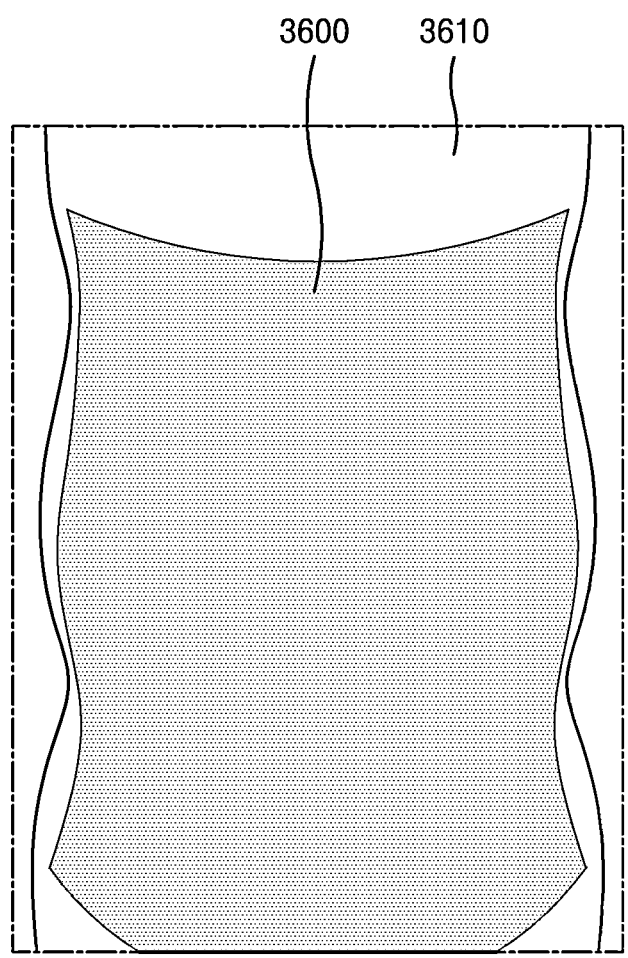

FIG. 24F illustrates that an electronic apparatus according to an embodiment is an advertising or exhibition electronic apparatus 3600. In some embodiments, the advertising or exhibition electronic apparatus 3600 may be installed on a fixed structure 3610 such as, for example, a wall or pillar. When the structure 3610 includes an uneven surface as illustrated in FIG. 24F, the advertising or exhibition electronic apparatus 3600 may also be arranged along the uneven surface of the structure 3610. In some embodiments, the advertising or exhibition electronic apparatus 3600 may be installed on the structure 3610 by using a heat-shrink film or the like.

Figure 24G:
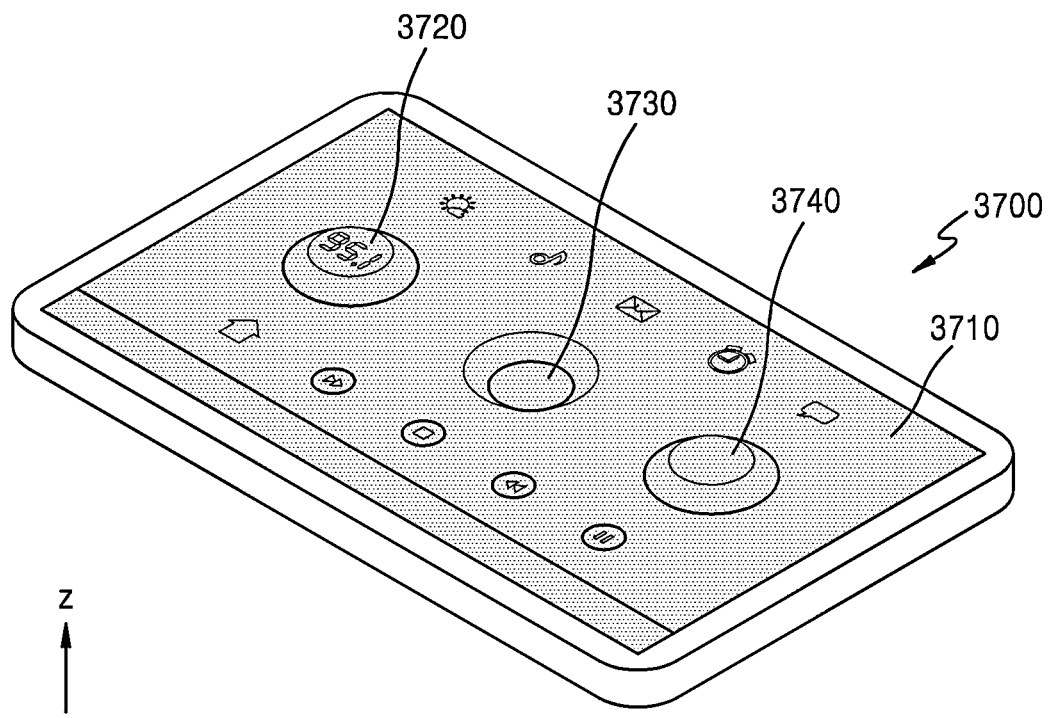

FIG. 24G illustrates that an electronic apparatus according to an embodiment is a controller 3700. The controller 3700 may include an image-type button. For example, the controller 3700 may include first to third button areas 3720, 3730, and 3740 in which a portion of a display 3710 protrudes in the z-direction or protrudes in the −z direction (or is recessed in the z-direction). In some embodiments, the first and third button areas 3720 and 3740 may protrude in the z-direction, and the second button area 3730 may protrude in the −z direction (or be recessed in the z-direction).

The disclosure has been described with reference to the one or more embodiments illustrated in the accompanying drawings, but should be considered in a descriptive sense and not for purposes of limitation. Those of ordinary skill in the art will understand that various modifications and equivalent embodiments may be made therefrom. Therefore, the true technical scope of protection of the disclosure should be defined by the technical spirit of the appended claims.

According to one or more embodiments, a display apparatus having improved display quality may be provided. However, the scope of the disclosure is not limited to the above effects.

Embodiments of the present disclosure support one or more processes (methods) supportive of the features and embodiments described herein. Descriptions that an element "may be disposed," "may be formed," "may be electrically connected," and the like include processes (methods) for disposing, forming, positioning, connecting, and modifying the element in accordance with example aspects described herein.

It should be understood that the embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a display area in which a plurality of island portions and a plurality of bridge portions connected to the plurality of island portions are defined, wherein each of the plurality of bridge portions connects at least two island portions of the plurality of island portions,
   wherein a pixel circuit and a light-emitting diode connected to the pixel circuit are arranged in each of the plurality of island portions,
   the pixel circuit comprising:
   a first transistor;
   a second transistor electrically connected to a first terminal of the first transistor and a node;
   a third transistor electrically connected to a first voltage line and the node;
   a fourth transistor electrically connected to the node and a second voltage line;
   a first capacitor electrically connected to a gate of the first transistor and the node; and
   a second capacitor electrically connected to a first electrode of the light-emitting diode and the second voltage line,
   wherein:
   the plurality of bridge portions comprise a first bridge portion connecting island portions adjacent in a first direction and a second bridge portion connecting island portions adjacent in a second direction, and the second voltage line comprises a first horizontal voltage line in the first bridge portion and a first vertical voltage line in the second bridge portion,
wherein the first vertical voltage line comprises a first sub-line and a second sub-line and, in a plan view, the first sub-line and the second sub-line are spaced apart from each other.

2. The display apparatus of claim 1, wherein the pixel circuit further comprises a fifth transistor electrically connected to a data line and the first terminal of the first transistor,
the data line extends in the second direction and is arranged in the second bridge portion and in the island portions adjacent in the second direction, and,
in the plan view, in the second bridge portion, the data line does not overlap the first sub-line and the second sub-line.

3. The display apparatus of claim 2, wherein the second bridge portion comprises:
a first insulating layer between a substrate and the first vertical voltage line; and
a second insulating layer between the first vertical voltage line and the data line.

4. The display apparatus of claim 3, wherein a first horizontal voltage connection line electrically connected to the first voltage line is arranged in the first bridge portion, and a first vertical voltage connection line electrically connected to the first voltage line is arranged in the second bridge portion.

5. The display apparatus of claim 4, wherein, in the plan view, the first vertical voltage connection line overlaps the first sub-line and the second sub-line.

6. The display apparatus of claim 5, further comprising a third insulating layer between the data line and the first vertical voltage connection line.

7. The display apparatus of claim 4, further comprising a third voltage line electrically connected to a second electrode of the light-emitting diode, the third voltage line comprising a second horizontal voltage line in the first bridge portion and a second vertical voltage line in the second bridge portion.

8. The display apparatus of claim 7, wherein the first horizontal voltage connection line and the second horizontal voltage line in the first bridge portion are arranged on a same layer, and
the first vertical voltage connection line and the second vertical voltage line in the second bridge portion are arranged on a same layer.

9. The display apparatus of claim 8, wherein, in the plan view, the first vertical voltage connection line and the second vertical voltage line do not overlap the data line.

10. The display apparatus of claim 1, wherein the second capacitor comprises a first electrode and a second electrode that is disposed on the first electrode and overlaps the first electrode, and
each of the plurality of island portions comprises:
a first connection electrode electrically connected to the first electrode of the second capacitor;
a second connection electrode electrically connected to the second electrode of the second capacitor and the second voltage line; and
a third connection electrode electrically connected to the first connection electrode.

11. The display apparatus of claim 10, wherein the first electrode of the second capacitor and the gate of the first transistor are arranged on a same layer.

12. The display apparatus of claim 1, wherein the first capacitor comprises a first electrode and a second electrode that is disposed on the first electrode and overlaps the first electrode,
the first electrode of the first capacitor is a portion of the gate of the first transistor, and
the second electrode of the first capacitor is electrically connected to the node.

13. The display apparatus of claim 12, wherein the second electrode of the first capacitor and the second electrode of the second capacitor are arranged on a same layer.

14. The display apparatus of claim 10, wherein each of the plurality of island portions comprises:
a first electrode pad electrically connected to the third connection electrode and the first electrode of the light-emitting diode;
a third voltage line comprising a second horizontal voltage line in the first bridge portion and a second vertical voltage line in the second bridge portion; and
a second electrode pad electrically connected to the third voltage line and the second electrode of the light-emitting diode.

15. A display apparatus comprising:
a display area in which a plurality of island portions and a plurality of bridge portions connected to the plurality of island portions are defined, wherein each of the plurality of bridge portions connects at least two island portions of the plurality of island portions,
wherein each of the plurality of island portions comprises:
a first pixel circuit connected to a first data line;
a second pixel circuit connected to a second data line; and
a third pixel circuit connected to a third data line,
wherein each of the first pixel circuit, the second pixel circuit, and the third pixel circuit comprises:
a first transistor;
a second transistor electrically connected to a first terminal of the first transistor and a node;
a third transistor electrically connected to a first voltage line and the node;
a fourth transistor electrically connected to the node and a second voltage line;
a first capacitor electrically connected to a gate of the first transistor and the node; and
a second capacitor electrically connected to a first electrode of a light-emitting diode and the second voltage line,
wherein:
the second capacitor comprises a first electrode and a second electrode,
the first electrode of the second capacitor is electrically connected to the first electrode of the light-emitting diode, and the second electrode of the second capacitor is electrically connected to the second voltage line, and
wherein the second electrodes of the second capacitors of the first pixel circuit, the second pixel circuit, and the third pixel circuit are integrated as a single body.

16. The display apparatus of claim 15, wherein the plurality of bridge portions comprise a first bridge portion connecting island portions adjacent in a first direction and a second bridge portion connecting island portions adjacent in a second direction, and
the second voltage line comprises a first horizontal voltage line in the first bridge portion and a first vertical voltage line in the second bridge portion, wherein the first vertical voltage line comprises a first sub-line and a second sub-line and, in a plan view, the first sub-line and the second sub-line are spaced apart from each other.

17. The display apparatus of claim 16, wherein the first data line, the second data line, and the third data line extend to the second bridge portion, and,
    in a plan view, in the second bridge portion, the first sub-line is between the first data line and the second data line, and the second sub-line is between the second data line and the third data line.

18. The display apparatus of claim 17, wherein:
    a third voltage line electrically connected to a second electrode of the light-emitting diode is arranged in each of the plurality of island portions,
    the third voltage line comprises a second horizontal voltage line in the first bridge portion and a second vertical voltage line in the second bridge portion,
    a horizontal voltage connection line electrically connected to the first voltage line is arranged in the first bridge portion,
    a vertical voltage connection line electrically connected to the first voltage line is arranged in the second bridge portion, and,
    in a plan view, in the second bridge portion, the second vertical voltage line and the vertical voltage connection line do not overlap the first data line, the second data line, and the third data line.

19. The display apparatus of claim 15, wherein the first electrode of the second capacitor and the gate of the first transistor are arranged on a same layer.

20. The display apparatus of claim 15, wherein:
    the first capacitor comprises a first electrode and a second electrode,
    the first electrode of the first capacitor is a portion of the gate of the first transistor, and
    the second electrode of the first capacitor is electrically connected to the node.

* * * * *